United States Patent [19]

Furutani

[11] Patent Number: 5,642,317
[45] Date of Patent: Jun. 24, 1997

[54] SEMICONDUCTOR MEMORY DEVICE INCORPORATING A TEST MECHANISM

[75] Inventor: Kiyohiro Furutani, Hyogo, Japan

[73] Assignee: Mitsubishi Denki Kabushiki Kaisha, Tokyo, Japan

[21] Appl. No.: 551,484

[22] Filed: Nov. 1, 1995

[30] Foreign Application Priority Data

May 16, 1995 [JP] Japan .................... 7-117074

[51] Int. Cl.$^6$ .................... G11C 7/00; G11C 29/00
[52] U.S. Cl. .................. 365/201; 365/189.07; 365/225.7
[58] Field of Search .................... 365/201, 189.07, 365/189.05, 189.08, 225.7

[56] References Cited

U.S. PATENT DOCUMENTS

| 536,869 | 7/1895 | Yoshida | 365/189.07 |
| 5,404,332 | 4/1995 | Sato et al. | 365/201 |

OTHER PUBLICATIONS

1987 IEEE International Solid-State Circuits Conference, pp. 286–287, Feb. 27, 1987, T. Ohsawa, et al., "FAM 20.9: A 60ns 4Mb CMOS DRAM With Built-In-Self-Test".

1992 IEEE International Solid-State Circuits Conference, pp. 150–151, Feb. 20, 1992, H. Koike, et al., "TP 9.2: A 30ns 64Mb DRAM With Built-In Self-Test and Repair Function".

*Primary Examiner*—David C. Nelms
*Assistant Examiner*—Huan Hoang
*Attorney, Agent, or Firm*—Oblon, Spivak, McClelland, Maier & Neustadt, P.C.

[57] ABSTRACT

To present a semiconductor memory device incorporating a test mechanism in order to test plural semiconductor memory devices by using a tester having a single data judging circuit. The drain electrode of an N type MOSFET (Q16) is connected to a power source potential ($V_{CC}$) through a fuse element (F1) (route cut-off element), and the source electrode is connected to the drain electrode of an N type MOSFET (Q17), and the drain electrode of the N type MOSFET (Q16) is connected to the input of an inverter (G16), and is also connected to a resistance element (R1) connected to a grounding potential ($V_{SS}$). Therefore, since the test mechanism is incorporated, parallel tests are conducted by the inexpensive tester having only one data judging circuit, and thereafter by judging the results of comparison individually by using the same tester, the qualification of the semiconductor memory device can be judged.

18 Claims, 19 Drawing Sheets

SEMICONDUCTOR MEMORY DEVICE INCORPORATING A TEST MECHANISM

BACKGROUND OF THE INVENTION

1. Field of the Invention

The present invention relates to a semiconductor memory device, and more particularly to a dynamic RAM incorporating a test mechanism.

2. Description of the Background Art

Manufactured DRAM chips are shipped after testing all memory cells to verify normal writing and reading by means of a tester. As the memory capacity of DRAM chips tends to increase, the testing time increases. For example, in a 64M (megabit) DRAM chips, a simple test procedure of writing "1" in all memory cells, reading "1" from all memory cells, writing "0" in all memory cells, and reading "0" from all memory cells in a cycle time of 90 ns takes $90 \times 19^{-9} \times 4 \times 64 \times (1024)^2 = 24$ seconds.

Actually, testing in a test procedure adding various inspection items takes about 300 seconds. However, since DRAM chips must be mass produced at a rate of several million per month, the processing capacity is raised and the testing time is shortened by measuring plural DRAM chips simultaneously.

FIG. 22 shows a configuration for simultaneous parallel measurement of plural DRAM chips. In FIG. 22, n test pieces, DRAM chips M1 to Mn, are connected in parallel to a tester 70. The tester 70 possesses n signal drivers D11 to D1n, and n data judging circuits J11 to J1n. The signal driver D11 and data judging circuit J11 are connected to DQ pin of the DRAM chip M1, and write data is applied to the DQ pin of the DRAM chip M1 in a write cycle, and the data judging circuit J11 judges if the DRAM chip M1 outputs correct read data in a read cycle. Similarly, thereafter, the signal driver D12 and data judging circuit J12 are connected to DQ pin of the DRAM chip M2, and signal driver D1n and data judging circuit J1n to DQ pin of the DRAM chip Mn, sequentially.

The tester 70 is also designed to give specific signals to bar RAS pin, bar CAS pin, bar OE pin, bar WE pin and address signal pins of individual DRAM chips M which are not shown in the drawing.

Hitherto, as mentioned above, using a tester having as many signal drivers and data judging circuits as the number of n DRAM chips to be tested, by testing n DRAM chips simultaneously, the processing capacity was raised and the testing time was shortened. However, the tester having a plurality of data judging circuits is expensive, and the testing cost tended to increase.

SUMMARY OF THE INVENTION

A first aspect of the invention relates to a semiconductor memory device for writing and reading data in a memory cell array through a pair of input and output wires comprising a data input/output terminal for input and output of the data, write means connected to the data input/output terminal for writing data in the memory cell array through the pair of input and output wires, read means for reading data from the memory cell array through the pair of input and output wires, output means connected between the data input/output terminal and the read means, for outputting the data being read out by the read means into the data input/output terminal, expected value hold means connected to the data input/output terminal for holding temporarily expected value data given from outside, comparative means connected to the expected value hold means and read means, for comparing the data being readout by the read means and the expected value data, and outputting the result of comparison, comparative result hold means connected to the comparative means, for holding the result of comparison in a non-volatile manner, and outputting the test result signal reflecting the result of comparison, and control means for outputting a control signal for controlling the expected value hold means, comparative result hold means, and output means, wherein correctness or incorrectness of write and read action is shown outside, by using the test result signal outputted from the comparative result hold means.

A second aspect of the invention relates to a semiconductor memory device, wherein the output means comprises a buffer circuit which is set in a high impedance state by receiving the test result signal from the control means, at the time of input of expected value data from outside through the input/output terminal.

A third aspect of the invention relates to a semiconductor memory device, wherein the output means comprises a buffer circuit which is set in a high impedance state when the read data and expected value data do not coincide with each other.

A fourth aspect of the invention relates to a semiconductor memory device, wherein the control means posesses an OE signal input terminal for receiving an OE signal for indicating an output timing of the data, gives a control signal on the basis of the OE signal to the comparative result hold means, and instructs the timing for holding the result of comparison.

A fifth aspect of the invention relates to a semiconductor memory device, wherein the control means possesses plural signal input terminals for receiving control signals from outside, further comprising wrong action indicating means having at least one switch element between one of the signal input terminals and a grounding potential, for receiving the test result signal, closing the switch element when the read data and the expected value data do not coincide, and passing a current between the signal input terminal and the grounding potential, thereby indicating the write and read action is wrong.

A sixth aspect of the invention relates to a semiconductor memory device, wherein the comparative result hold means comprises a first route having a resistance element and a route cut-off element disposed in series between a first potential and a second potential, a second route extended from the connection point of the resistance element and the route cut-off element, and connected to a route for outputting the test result signal, and cut-off element control means connected to the route cut-off element, receiving the comparative result, and controlling the route cut-off of element so as to cut off the connection of the first route when the expected value data and the read data do not coincide, and keep the connection of the first route when the expected value data and the read data coincide with each other.

A seventh aspect of the invention relates to a semiconductor memory device, wherein the route cut-off element is a fuse element, and the cut-off element control means has a switch element inserted between the fuse element and the second potential, closes the switch element and passes an overcurrent to the fuse element when the expected value data and read data do not coincide, and thereby melting down the fuse element and cutting off connection of the first route.

An eighth aspect of the invention relates to a semiconductor memory device, wherein the route cut-off element is a floating gate transistor having one electrode connected to the second potential, and the cut-off element control means comprises a first switch element and a resistance element inserted between other electrode of the floating gate transistor and a third potential, and a second switch element inserted between a control electrode of the floating gate transistor and the third potential, the cut-off element control means closing the first and second switch elements, when the expected value data and read data do not coincide, and setting the potential of the control electrode of the floating gate transistor higher than the potential of the other electrode of the floating gate transistor, supplying electrons to the floating gate, and preventing the floating gate transistor from conducting, thereby cutting off connection of the first route.

A ninth aspect of the invention relates to a semiconductor memory device for writing and reading data in a memory cell array through a pair of input and output wires comprising a data input terminal for input of the data, a data output terminal for output of the data, write means connected to the data input terminal for writing data in the memory cell array through the pair of input and output wires, read means for reading data from the memory cell array through the pair of input and output wires, output means connected between the read means and the data output terminal, for outputting the data being read out by the read means into the data output terminal, expected value hold means connected to either the data input terminal for the data output terminal for holding temporarily expected value data given from outside, comparative means connected to the expected value hold means and read means, for comparing the data being readout by the read means and the expected value data, and outputting the result of comparison, comparative result hold means connected to the comparative means, for holding the result of comparison, and outputting the test result signal reflecting the result of comparison, and control means for outputting a control signal for controlling the expected value hold means, comparative result hold means, and output means, wherein correctness or incorrectness of write and read action is shown outside, by using the test result signal outputted from the comparative result hold means.

A tenth aspect of the invention relates to a semiconductor memory device, wherein the output means comprises a buffer circuit which is set in a high impedance state by receiving the test result signal, when the read data and the expected value do not coincide with each other.

An eleventh aspect of the invention relates to a semiconductor memory device, wherein the expect value hold means is connected to the data input terminal.

A twelfth aspect of the invention relates to a semiconductor memory device, wherein the control means is connected to the data output terminal, the output means comprises a buffer circuit which is set in a high impedance state by receiving an output control signal from the control means, at the time of input of a signal indicating an output timing of the data from outside through the data output terminal, and the control means gives a control signal on the basis of the signal indicating the output timing of the data to the comparative result hold means, and instructs the timing for holding the result of comparison.

A thirteenth aspect of the invention relates to a semiconductor memory device, wherein the expected value hold means is connected to the data output terminal, the output means comprises a buffer circuit which is set in a high impedance state by receiving an output control signal from the control means, at the time of input of expected value data from outside through the data output terminal.

A fourteenth aspect of the invention relates to a semiconductor memory device, wherein the control means is connected to the data input terminal, and the control means gives a control signal on the basis of the signal indicating the output timing of the data to the comparative result hold means, and instructs the timing for holding the result of comparison.

A fifteenth aspect of the invention relates to a semiconductor memory device, wherein the control means includes a plurality of signal input terminals for receiving control signals from outside, further comprising wrong action indicating means having at least one switch element between one of the signal input terminals and a grounding potential, for receiving the test result signal, closing the switch element when the read data and the expected value data do not coincide, and passing a current between the signal input terminal and the grounding potential, thereby indicating the write and read action is wrong.

A sixteenth aspect of the invention relates to a semiconductor memory device, wherein the comparative result hold means comprises a first route having a resistance element and a route cut-off element disposed in series between a first potential and a second potential, a second route extended from the connection point of the resistance element and the route cut-off element, and connected to a route for outputting the test result signal, and cut-off element control means connected to the route cut-off element, receiving the comparative result, and controlling the route cut-off element so as to cut off the connection of the first route when the expected value data and the read data do not coincide, and keep the connection of the first route when the expected value data and the read data coincide with each other.

A seventeenth aspect of the invention relates to a semiconductor memory device, wherein the route cut-off element is a fuse element, and the cut-off element control means has a switch element inserted between the fuse element and the second potential, closes the switch element and passes an overcurrent to the fuse element when the expected value data and read data do not coincide, and thereby melting down the fuse element and cutting off connection of the first route.

An eighteenth aspect of the invention relates to a semiconductor memory device, wherein the route cut-off element is a floating gate transistor having one electrode connected to the second potential, and the cut-off element control means comprises a first switch element and a resistance element inserted between another electrode of the floating gate transistor and a third potential, and a second switch element inserted between a control electrode of the floating gate transistor and the third potential, for closing the first and second switch elements, when the expected value data and read data do not coincide, and setting the potential of the control electrode of the floating gate transistor higher than the potential of the another electrode of the floating gate transistor, supplying electrons to the floating gate, and preventing the floating gate transistor from conducting, thereby cutting off connection of the first route.

According to the semiconductor memory device of the first aspect of the invention, the data given through the data input/output terminal is written into the memory cell array by the write means, and the data is read out by the read means, and outputted into the data input/output terminal through the output means, and on the basis of the plural control signals from the control means given from outside through the data input/output terminal, the expected value data temporarily held in the expected value holding means and read data are compared in the comparative means, the result of comparison is held in the comparative result holding means, and the test result signal reflecting the result of comparison can be outputted, so that correctness or incorrectness of write and read action can be shown outside.

Therefore, so to speak, the function for write and read action test is incorporated, and in the case of parallel performance of write and write test on plural semiconductor memory devices, it is not necessary to connect test device for write and read action test to outside the device on the individual semiconductor memory device, so that the costs for the test can be curtailed.

According to the semiconductor memory device of the second aspect of the invention, the output means is set in a high impedance state by receiving an output control signal from the control means when the expected value data is inputted from outside through the data input/output terminal.

According to the semiconductor memory device of the third aspect of the invention, the buffer circuit is provided to be set in a high impedance state, on the basis of the test result signal, when the expected value data is given to the expected value holding means and the read data and expected value data do not coincide, so that the data cannot be read in the read cycle, thereby judging a wrong action in writing and reading.

According to the semiconductor memory device of the fourth aspect of the invention, the OE signal indicating the output of the data from the OE signal input terminal is inputted, and the control signal on the basis of the OE signal is given to the comparative result holding means, so that the timing for holding the comparative result can be indicated.

According to the semiconductor memory device of the fifth aspect of the invention, even by the flow of a current between one of the signal input terminals of the control means and the grounding potential, wrong action in writing and reading is known.

Therefore, as the output means falls in a high impedance state in the read cycle, it is not necessary to indicate wrong action of writing or reading, so that the constitution of the output means may be simplified.

According to the semiconductor memory device of the sixth aspect of the invention, the comparative result holding means comprises a first route having a resistance element and route cut-off element disposed in series between the first potential and second potential, the route cut-off element is connected to the cut-off element control means, and, receiving the result of comparison, when the expected value data and read data do not coincide, connection of the first route is cut off, and when the expected value data and read data coincide, it is controlled to keep the connection of the first route.

Therefore, the result of comparison is held depending on whether the first route is cut off or not, so that the constitution of the comparative result holding means may be simplified.

According to the semiconductor memory device of the ninth aspect of the invention, the data given through the data input terminal is written into the memory cell array by the write means, and the data is read out by the read means, and outputted into the data output terminal through the output means, and on the basis of the plural control signals from the control means, the expected value data temporarily held in the expected value holding means and read data are compared in the comparative means, the result of comparison is held in the comparative result holding means, and the test result signal reflecting the result of comparison can be outputted, so that correctness or incorrectness of write and read action can be shown outside.

Therefore, so to speak, the function for write and read action test is incorporated, and in the case of parallel performance of write and write test on plural semiconductor memory devices, it is not necessary to connect test device for write and read action test to outside the device on the individual semiconductor memory device, so that the costs for the test can be curtailed.

According to the semiconductor memory device of the tenth aspect of the invention, when the signal indicating output of data is given to the control means and the read data and expected value data do not coincide, so that the data cannot be read in the read cycle, thereby judging a wrong action in writing and reading.

According to the semicondutor memroy device of the twelfth aspect of the invention, the output means is set in a high impedance state by receiving an output control signal from the control means when the signal indicating the output of data from outside is inputted into the control means through the data output terminal, and therefore the buffer circuit is provided to be set in a high impedance state. Besides, the signal indicating the output of the data from the data output terminal is inputted, and the control signal on the basis of the signal indicating the output of the data is given to the comparative result holding means, so that the timing for holding the comparative result can be indicated.

According to the semiconductor memory device of the thirteenth aspect of the invention, the data output terminal is connected to the expected value holding means, and the output means is set in a high impedance state by receiving an output control signal from the control means when the expected value data is inputted from outside through the data output terminal, and therefore the buffer circuit is provided to be set in a high impedance state, when the expected value data is given to the expected value holding means and the read data and expected value data do not coincide, so that the data cannot be read in the read cycle, thereby judging a wrong action in writing and reading.

According to the semiconductor memory device of the fourteenth aspect of the invention, the signal indicating the output of the data from the data input terminal is inputted, and the control signal on the basis of the signal indicating the output of the data is given to the comparative result holding means, so that the timing for holding the comparative result can be indicated.

According to the semiconductor memory device of the seventeenth aspect of the invention, the route cut-off element is a fuse element, and when the expected value data and read data do not coincide, by closing the switch element of the cut-off element control means, an overcurrent is passed in the fuse element to melt, thereby cutting off the connection of the first route.

Therefore, the constitution for holding the result of comparison in a non-volatile manner can be obtained in an extremely simple constitution.

According to the semiconductor memory device of the eighteenth aspect of the invention, the route cut-off element is a floating gate transistor having one electrode connected a second potential, and when the expected value data and read data do not coincide, the first and second switch elements of the cut-off element control means are cut off, and an electron is supplied to the floating gate to prevent the floating gate transistor from conducting, thereby cutting off the connection of the first route.

Therefore, the result of comparison can be held in a non-volatile manner unless the electric charge accumulated in the floating gate is discharged, that is, the state is initialized. Besides, since the route cut-off element is a floating gate transistor, it is suited to the constitution incorporating a function for write and read action test in the EEPROM or EPROM using floating gate transistor.

It is therefore an object of the present invention to provide a semiconductor memory incorporating a test mechanism in order to test plural semiconductor memory devices by using a tester having only one data judging circuit, thereby solving the problems of the prior art.

These and other objects, features, aspects and advantages of the present invention will become more apparent from the following description of the present invention when taken in conjunction with the accompanying drawings.

DESCRIPTION OF THE PREFERRED EMBODIMENTS

<First Preferred Embodiment>

<A. Device constitution>

Figure 1:
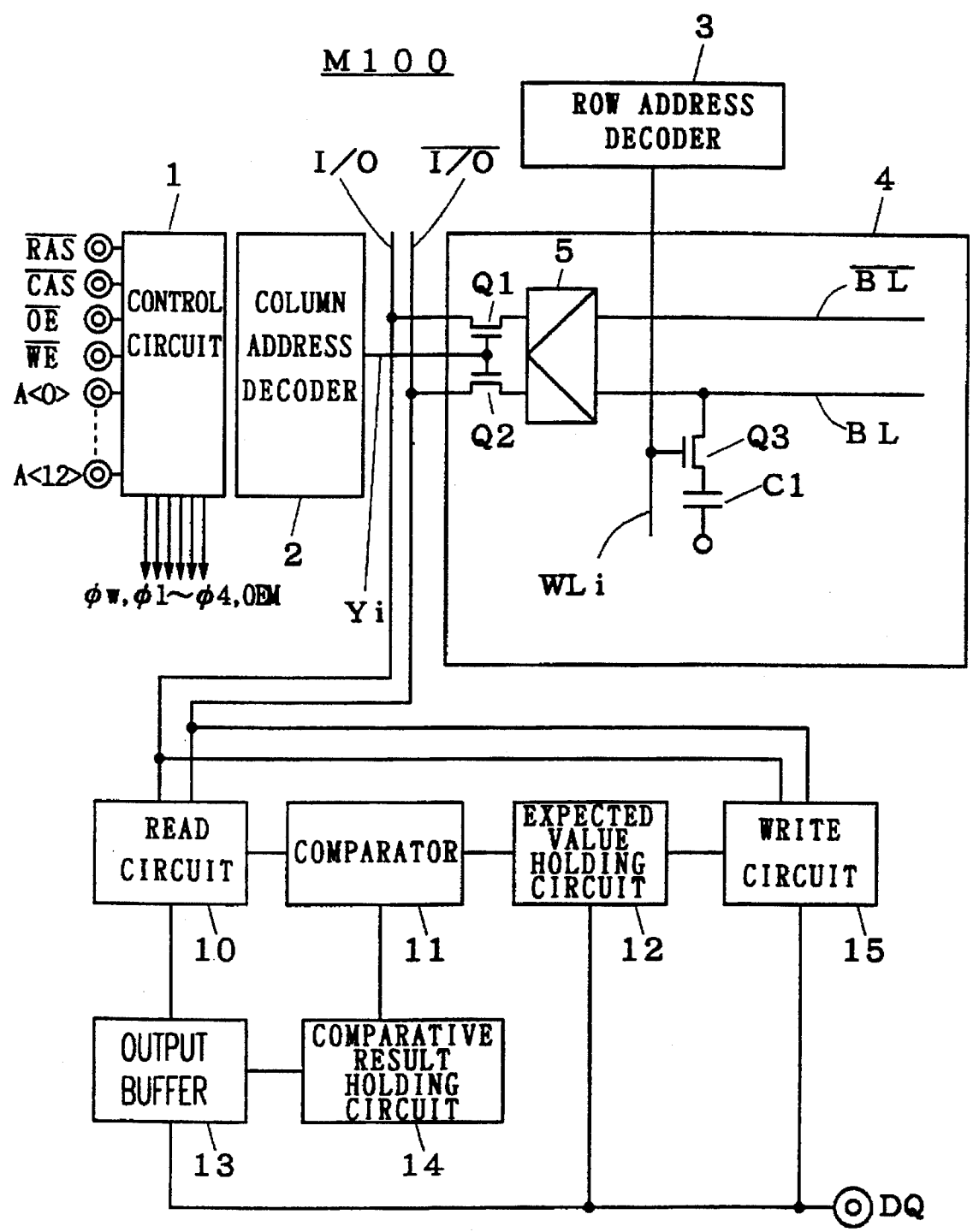
FIG. 1 is a block diagram explaining the constitution of a first preferred embodiment of a semiconductor memory device of the invention.

FIG. 1 shows the constitution of a DRAM chip M100 incorporating a test mechanism as a first preferred embodiment of a semiconductor memory device of the invention. In FIG. 1, the DRAM chip M100 comprises, same as in the prior art, a control circuit 1 having bar RAS pin, bar CAS pin, bar OE pin, a bar WE pin, and address signal pins A<0> to A<12>, a memory cell array 4, and a column address decoder 2 and a row address decoder 3 connected to the memory cell array 4.

The memory cell array 4 comprises an N type MOSFET Q1 having a source electrode connected to a bar I/O wire, an N type MOS FET Q2 having a source electrode connected to an I/O wire, a sense amplifier 5 connected to drain electrodes of the N type MOSFETs Q1 and Q2, for comparing the potential difference of bit line bars BL, BL, and an N type MOSFET Q3 having a source electrode connected to the bit line bar BL, with a capacitor C1 connected to the drain electrode. Herein, the capacitor C1 and N type MOSFET Q3 form a memory cell. The gate electrodes of the N type MOSFETs Q1 and Q2 are commonly connected to the row address decoder 3. In FIG. 1, however, only a partial constitution of the memory cell array is shown.

To the I/O wire and bar I/O wire, further, a read circuit 10 for reading out data and a write circuit 15 for writing in data are connected. The read circuit 10 is connected with an output buffer 13 for outputting the read data to DQ pin (data input/output pin), and a comparator 11 for comparing the read data and expected value, and the comparator 11 is combined with an expected value holding circuit 12 for holding the expected value, and a comparative result holding circuit 14 for holding the result of comparison in the comparator 11, and the output buffer 13 is connected with the comparative result holding circuit 14, and the expected value holding circuit 12 and write circuit 15 are connected to DQ pin. FIG. 1 only shows one set of I/O line pairs, the formation connected thereto and the example of inputting an output data with one binary digit in a memory cell array. However, it is needless to say that other I/O line pairs which are not shown in FIG. 1 have the same kind of formation also.

Figure 2:
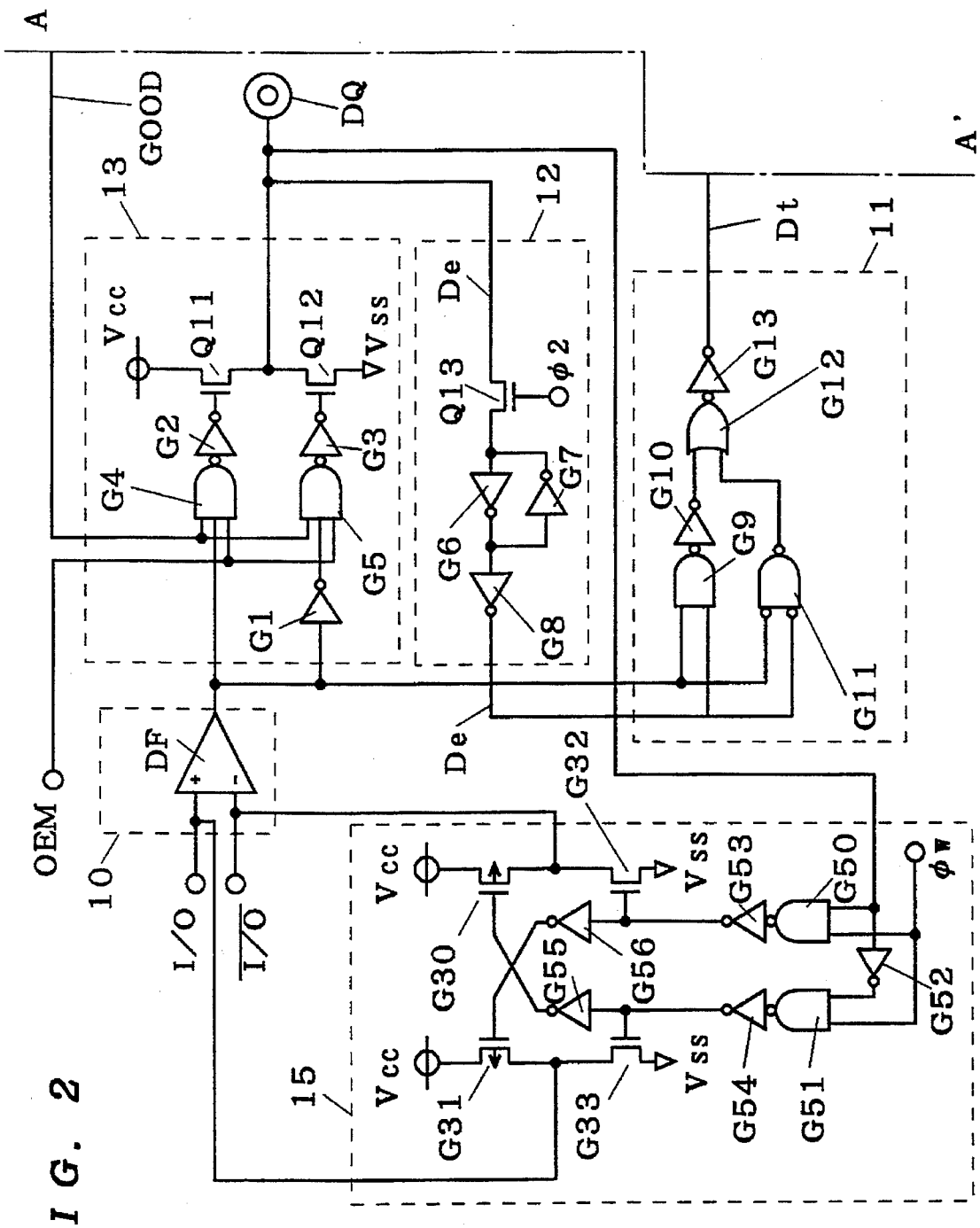
FIG. 2 is a circuit diagram explaining the constitution of the first preferred embodiment of the semiconductor memory device of the invention.
Figure 3:
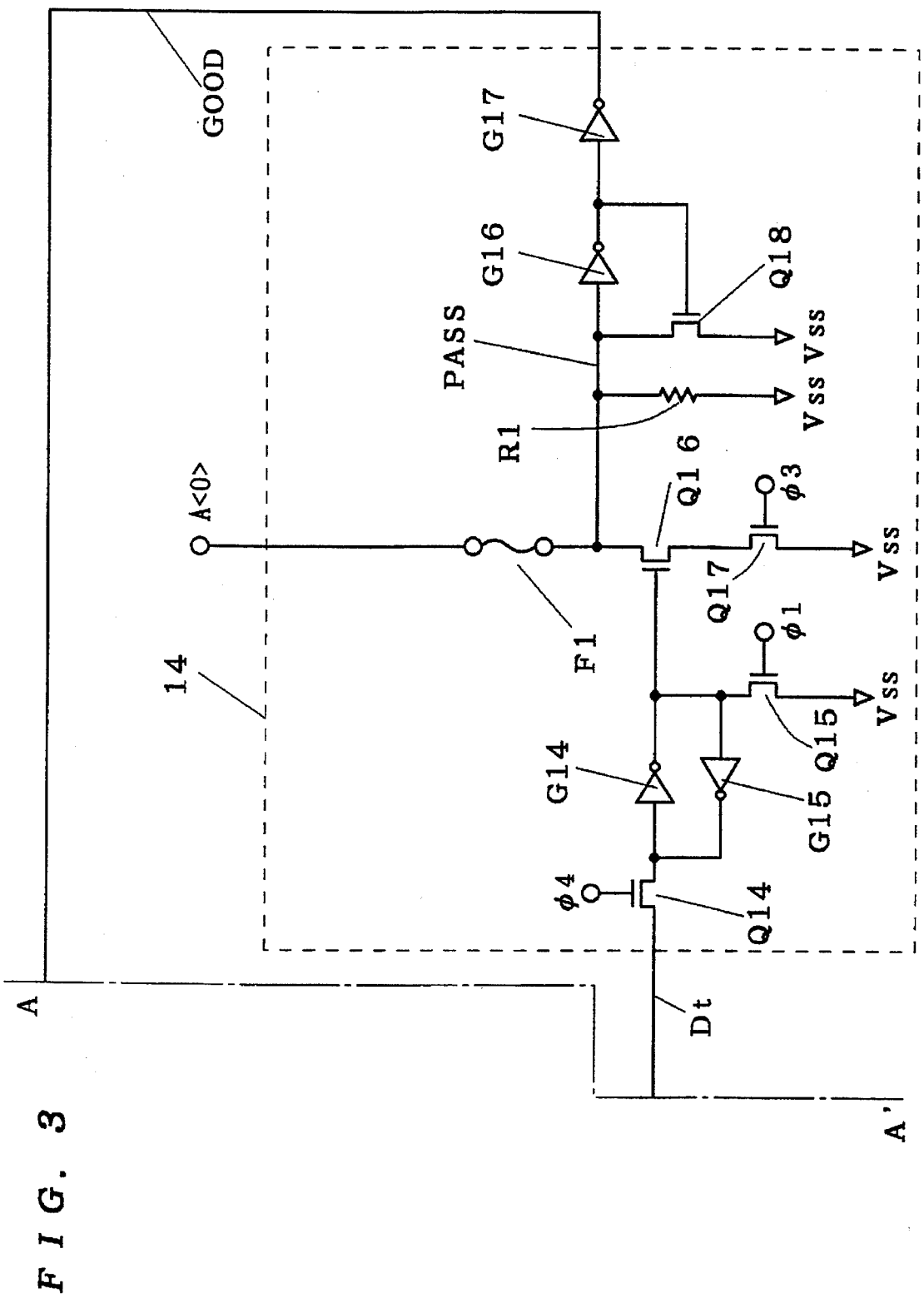
FIG. 3 is a circuit diagram explaining the constitution of the first preferred embodiment of the semiconductor memory device of the invention.

Referring now to FIG. 2 and FIG. 3 shown as circuit diagrams of a constitution of the DRAM chip M100, the constitution and operation of the control circuit 1, read circuit 10, comparator 11, expected value holding circuit 12, output buffer 13, comparative result holding circuit 14, and write circuit 15 are described below. FIG. 2 and FIG. 3 are coupled together along line AA'.

<A-1. Read circuit>

First the constitution is described. As shown in FIG. 2, the read circuit 10 is composed of a differential amplifier DF, and an I/O wire is connected to a + input, and a bar I/O wire to a − input. The output of the differential amplifier DF is given to an inverter G1 and a three-input NAND gate G4 of inverter G4 of the output buffer 13, and a NAND gate G9 of comparator 11.

<A-2. Output buffer>

The output buffer 13 possesses N type MOSFETs Q11 and Q12 connected in series between power source potential $V_{CC}$ and grounding potential $V_{SS}$, inverters G2, G3, and three-input NAND gates G4, G5. Common connection nodes of the N type MOSFETs Q11 and Q12 are connected to DQ pin. The output of the inverter G2 is connected to the gate electrode of the N type MOSFET Q11, and the output of the three-input NAND gate G4 is connected to the input of the inverter G2. To the input of the three-input NAND gate G4, output circuit control signal OEM (hereinafter called OEM signal), GOOD output from the comparative result holding circuit 14, and output from the differential amplifier DF are given.

The output of the inverter G3 is connected to the gate electrode of the N type MOSFET Q12, and the output of the three-input NAND gate G5 is connected to the input of the inverter G3. To the input of the three-input NAND gate G5, OEM signal, GOOD output from the comparative result holding circuit 14, and output of the inverter G1 are given.

<A-3. Expected value holding circuit>

The expected value holding circuit 12 possesses an N type MOSFET Q13, and inverters G6 to G8, and the expected value De given from the DQ pin are given to the drain electrode of the N type MOSFET Q13, the source electrode of the N type MOSFET Q13 is connected to the input of the inverter G6, the output of the inverter G6 is connected to the input of the inverter G8, and the output of the inverter G8 becomes expected value De. Herein, to the gate electrode of the N type MOSFET Q13, a $\phi 2$ signal is given. An inverter G7 is connected in a loop form to the inverter 6.

<A-4. Comparator>

The comparator 11 possesses a NAND gate G9, inverters G10, G13, and NOR gates G11, G12. To the input of the NAND gate G9, the output of the differential amplifier DF, and expected value De outputted from the expected value holding circuit 12 are given, and an inverter G10 is connected to the output of the NAND gate G9. To the input of the NOR gate G11, the output of the differential amplifier DF and expected value De outputted from the expected value holding circuit 12 are given, and the outputs of the NOR gate G11 and inverter G10 are given to the input of the NOR gate G12, and an inverter G13 is connected to the output of the NOR gate G12, and the output of the inverter G13 becomes output Dt of the comparator 11.

<A-5. Comparative result holding circuit>

The comparative result holding circuit 14 comprises N type MOSFETs Q14 to Q18, inverters G14 to G17, a resistance element R1, and a fuse element F1. The output Dt of the comparator 11 is given to the drain electrode of the N type MOSFET Q14, and the source electrode of the N type MOSFET Q14 is connected to the input of the inverter G14. The inverter G14 is connected with an inverter G15 in a loop form, and the output of the inverter G14 is connected to the drain electrode of the N type MOSFET Q15 and gate electrode of the N type MOSFET Q16. Herein, the source electrode of the N type MOSFET Q15 is connected to the grounding potential $V_{SS}$, and a $\phi 1$ signal is given to the gate electrode.

The drain electrode of the N type MOSFET Q16 is connected to the power source potential $V_{CC}$ through the fuse element F1 (route cut-off element), and the source electrode is connected to the drain electrode of the N type MOSFET Q17. The source electrode of the N type MOSFET Q17 is connected to the grounding potential $V_{SS}$, and a $\phi 3$ signal is given to the gate electrode.

The drain electrode of the N type MOSFET Q16 is connected to the input of the inverter G16, and is also connected to the resistance element R1 connected to the grounding potential $V_{SS}$, and the drain electrode of the N type MOSFET Q18 of which source electrode is connected to the grounding potential $V_{SS}$.

The output of the inverter G16 is connected to the input of the inverter G17 and gate electrode of the N type MOSFET Q18, and the output of the inverter G17 becomes a GOOD signal which is the output of the comparative result holding circuit 14.

<A-6. Write circuit>

The write circuit 15 possesses P type MOSFETs Q30 and Q31, N type MOSFETs Q32 and Q33, NAND gates G51 and G52, and inverters G52 to G56. The P type MOSFET Q30 and N type MOSFET Q32 are connected in series between the power source potential $V_{CC}$ and grounding potential $V_{SS}$, and connection nodes of the two are connected to a bar I/O wire. Similarly, the P type MOSFET Q31 and N type MOSFET Q33 are also connected in series between the power source potential $V_{CC}$ and grounding potential $V_{SS}$, and connection nodes of the two are connected to an I/O wire.

A DQ pin is connected directly to the input of the NAND gate G50, and is also connected to the input of the NAND gate G51 through the inverter G52, and a write circuit activating signal $\phi w$ given from the control circuit 1 is given directly to the inputs of NAND gates G50 and G51. Inverters G53 and G54 are respectively connected to the outputs of the NAND gates G50 and G51, and the output of the inverter G53 is connected to the gate electrode of the N type MOSFET Q32 and inverter G55. The output of the inverter G54 is connected to the gate electrode of the N type MOSFET Q33 and inverter G56. The output of the inverter G55 is connected to the gate electrode of the P type MOSFET Q31, and the output of the inverter G56 is connected to the gate electrode of the P type MOSFET Q30.

<A-7. Test control circuit>

Figure 4:
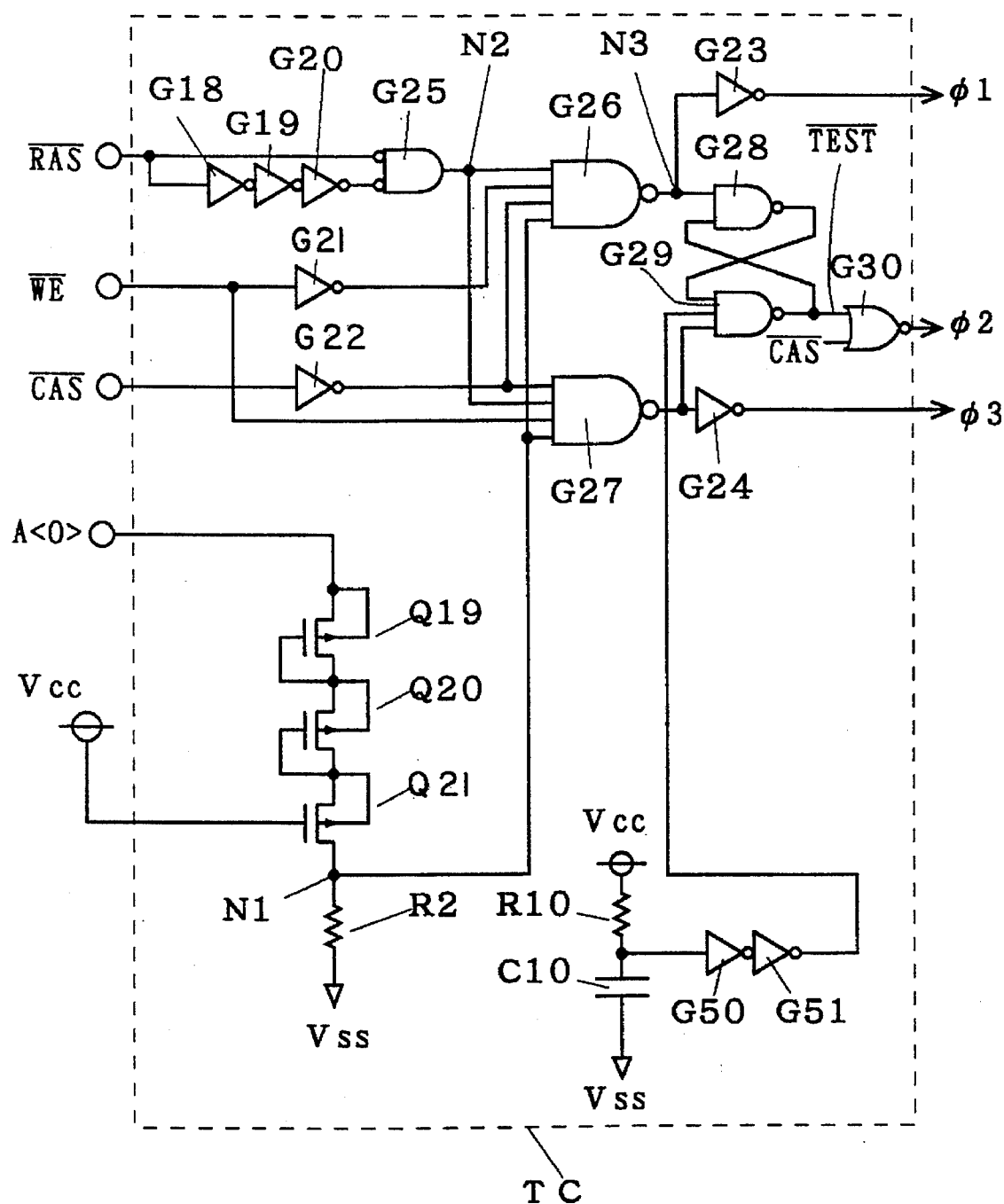
FIG. 4 is a circuit diagram explaining the constitution of a test control circuit in the first preferred embodiment of the semiconductor memory device of the invention.

Referring next to FIG. 4, the constitution of the test control circuit TC included in the control circuit 1 is described below. The test control circuit TC is a circuit for outputting control signals $\phi 1$ to $\phi 3$ and bar TEST signal for controlling the test mechanism of the DRAM chip M100.

As shown in FIG. 4, the test control circuit TC possesses inverters G18 to G24 and G50, G51, NOR gates G25, G30, NAND gates G26 to G29, P type MOSFETs Q19 to Q21, and resistance elements R2 and R20.

A bar RAS signal terminal is connected directly to the input of the NOR gate G25, and is connected to the inverter G18 out of the inverters G18 to G20 connected in series, and the output of the inverter G20 is connected to the input of the NOR gate G25. A bar WE signal terminal is connected to the inverter G21, and a bar CAS signal terminal is connected to the inverter G22.

An address pin A<0> is connected to the source electrode of the P type MOSFET Q19, and P type MOSFETs Q20 and Q21 are connected in series to the drain electrode of the P type MOSFET Q19, and the drain electrode of the P type MOSFET Q21 is connected to the grounding potential $V_{SS}$ through the resistance element R2. The gate electrodes of the P type MOSFETs Q19 and Q20 are connected to respective drain electrodes, and the gate electrode of the P type MOSFET Q21 is connected to the power source potential $V_{CC}$, and the back gates of the P type MOSFETs Q19, Q20, Q21 are connected to respective source electrodes. Herein, the connection point of the drain electrode of the P type MOSFET Q21 and resistance element R is called node N1.

The NAND gates G26 and G27 are of the four-input type, and to the NAND gate G26, the outputs of the NOR gate G25 and inverters G21, G22, and source electrode of the P type MOSFET Q21 are connected, and to the input of the NAND gate G27, the NOR gate G25, output of the inverter G22, and bar WE signal terminal are connected. Herein, the connection point of the output of the NOR gate G25 and input of the NAND gate G27 is called node N2.

The output of the NAND gate G26 is connected to the input of the inverter G23 and NAND gate G28, and the output of the NAND gate G27 is connected to the input of the inverter G24 and input of the NAND gate G29. Herein, the connection point of the inverter G23 is called node N3.

The output of the NAND gate G28 is connected to the input of the NAND gate G29, and the output of the NAND gate G29 is connected to the input of the NAND gate G28, and is also connected to one input of the NOR gate G30. Herein, the NAND gate G29 is of the three-input type, and to the remaining one input, the output of the power on reset circuit (POR circuit) for outputting "L" for a specific period after turning on the power is connected. Therefore, in the "L" period of the output of the POR circuit, a flip-flop circuit composed of NAND gates G28 and G29 is reset to "H". The output of the NAND gate G29 is a bar TEST signal. In the constitution of the POR circuit, a resistance element R10 and a capacitor C10 are sequentially connected in series between the power source potential $V_{CC}$ and grounding potential $V_{SS}$, the connection point of the resistance element R10 and capacitor C10 is inputted into the inverter G50, the output of the inverter G50 is inputted into the inverter G51, and the output of the inverter G51 is the output of the POR circuit.

To the other input of the NOR gate G30, a bar CAS signal terminal is connected, and a $\phi 2$ signal is outputted from the NOR gate G30. From the inverter G23, a $\phi 1$ signal is outputted, and from the inverter G24, a $\phi 3$ signal is outputted.

<A-8. OEM signal generating circuit>

Figure 5:
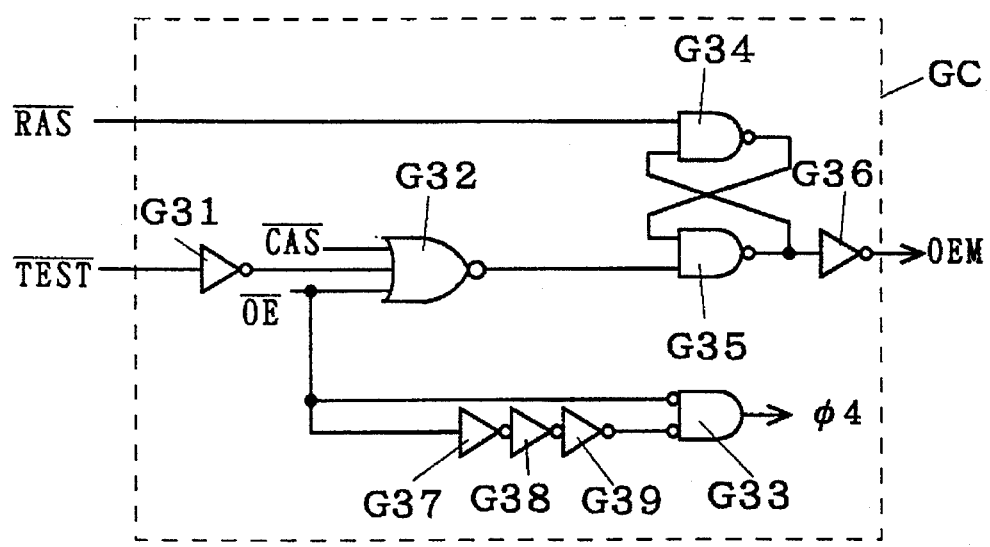
FIG. 5 is a circuit diagram explaining the constitution of an OEM signal generating circuit in the first preferred embodiment of the semiconductor memory device of the invention.

Referring to FIG. 5, the constitution of an OEM signal generating circuit GC contained in the control circuit 1 is described below. As shown in FIG. 5, the OEM signal generating circuit GC possesses inverters G31, G36 to G39, NOR gates G32 and G33, and NAND gates G34 and G35.

In FIG. 5, a bar TEST signal is inputted in the inverter G31, and to the NOR gate G32 of three inputs, bar CAS signal terminal and bar OE signal terminal are connected, and also the output of the inverter G31 is connected.

The bar RAS signal terminal is connected to the input of the NAND gate G34, and the output of the NOR gate G32 is connected to the input of the NAND gate 35G. The output of the NAND gate G34 is connected to the input of the NAND gate G35, and the output of the NAND gate G35 is connected to the input of the NAND gate G34 and is also connected to the inverter G36.

The bar OE signal terminal is connected directly to the NOR gate G33, and is connected to the inverter G37 out of the inverters G37 to G39 connected in series, and the output of the inverter G39 is connected to the NOR gate G33.

Herein, from the inverter G36, an OEM signal is outputted, and a $\phi 4$ signal is outputted from the NOR gate G33.

<B. Parallel test action>

Figure 6:
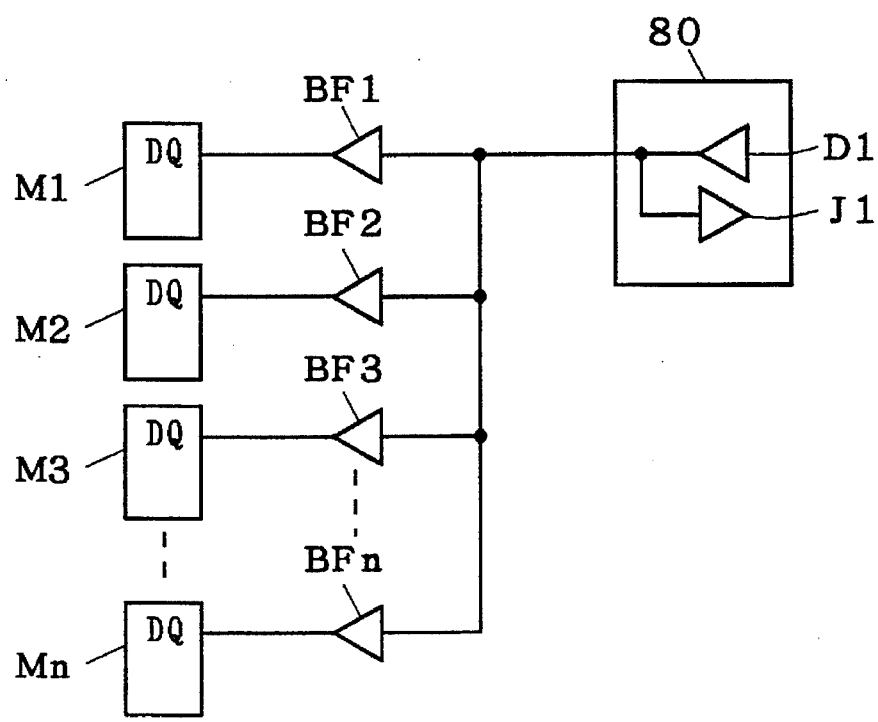
FIG. 6 is a structural diagram for parallel test by using the semiconductor memory device of the invention.
Figure 7:
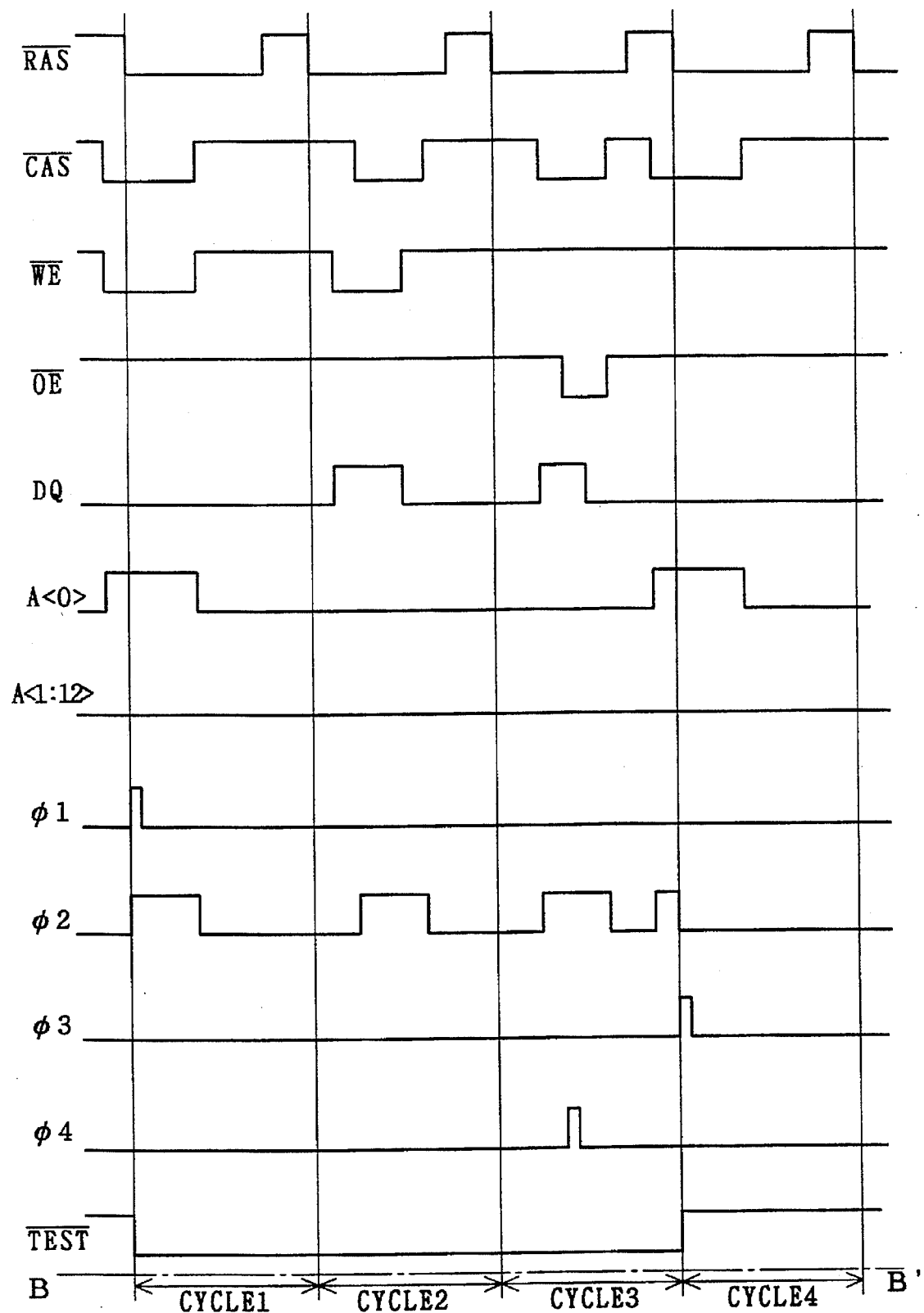
FIG. 7 is a timing chart for parallel test according to the first preferred embodiment of the semiconductor memory device of the invention.
Figure 8:
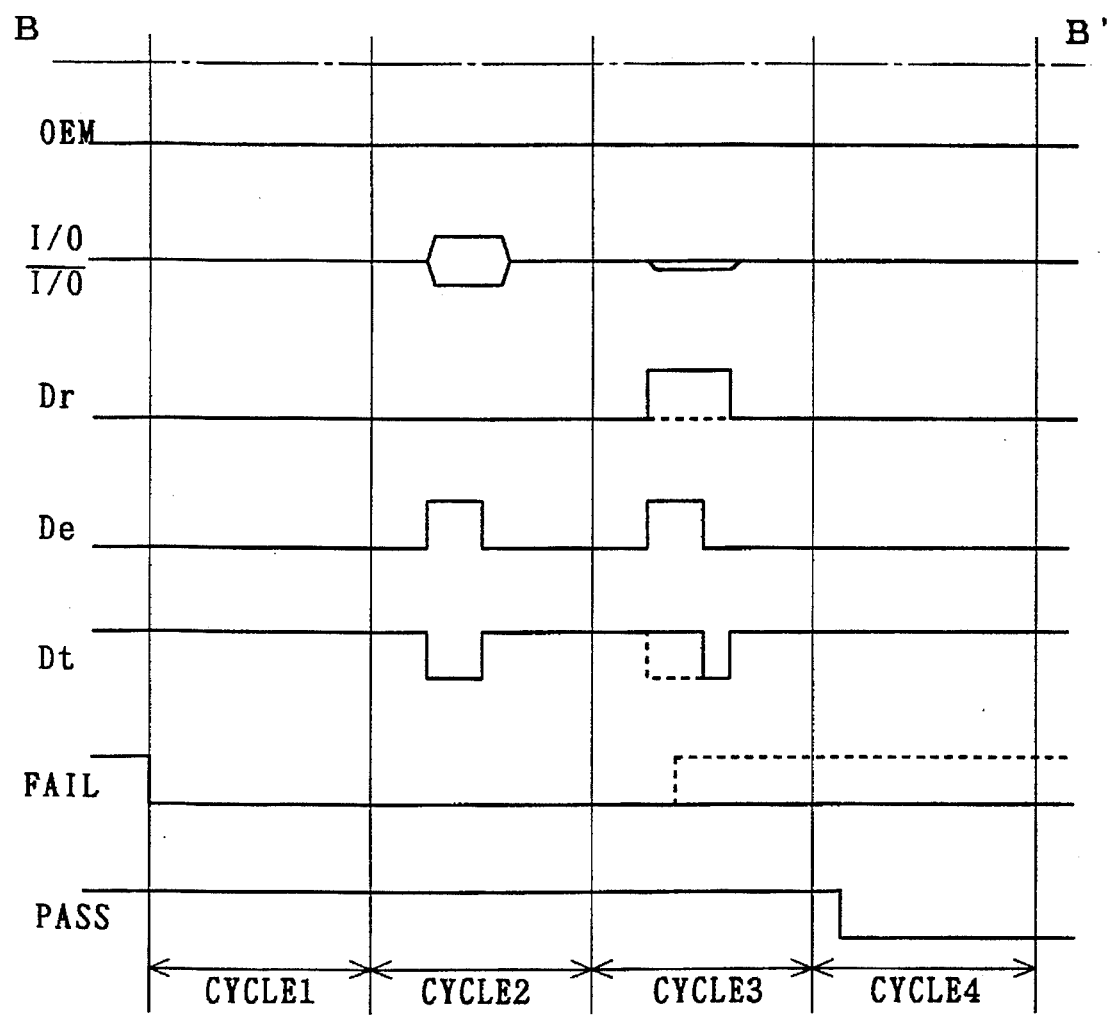
FIG. 8 is a timing chart for parallel test according to the first preferred embodiment of the semiconductor memory device of the invention.

Parallel test of the DRAM chip M100 incorporating the test mechanism is explained below by reference to FIG. 2 to FIG. 5, FIG. 6 showing the constitution for the test, and FIG. 7 and FIG. 8 show the timing chart of test action of DRAM chip M100. In FIG. 7 and FIG. 8, the broken line indicates the action in the event of wrong operation, and the solid line shows the normal action. FIG. 7 and FIG. 8 are coupled together at line BB'.

In FIG. 6, n test pieces, DRAM chips M1 to Mn, are connected to a tester 80 through buffer circuits BF1 to BFn, respectively. Herein, the DRAM chips M1 to Mn individually possess the test mechanism, and one of them is the DRAM chip M100. The buffer circuit BF1 to BFn is preliminarily provided in the test board for mounting DRAM chips M1 to Mn.

The tester 80 used in testing of DRAM incorporating test mechanism possesses only one signal driver D1 and one data judging circuit J1, and the input and output route of the tester 80 is branched, and is connected to n DRAM chips M1 to Mn. Herein, only one input and output route of the tester 80 is shown, but actually, there are routes for giving specific signals also in bar RAS pin, bar CAS pin, bar OE pin, bar WE pin, and address signal pin of the DRAM chip M100.

<B-1. Cycle 1>

First, in cycle 1 of bar RAS signal shown in FIG. 7 and FIG. 8, the operation mode of the DRAM chip M100 is changed from ordinary mode to test mode. To change from ordinary mode to test mode, prior to change from "H" to "L" of bar RAS signal, bar CAS signal and bar WE signal are changed from "H" to "L", and the value of the address pin A<0> is set at $V_{CC}+3|V_{THP}|$ or more (where $V_{THP}$ is the threshold value of the P type MOSFET), and the bar TEST signal becomes "L" at the timing of change of bar RAS signal from "H" to "L", thereby changing to the test mode. To change from the test mode to the ordinary mode, meanwhile, the power source is turned off.

The changeover action to the test mode is sequentially described below. After the bar RAS signal is changed to "L", the input of the NOR gate G25 becomes "H" for the portion of delay time by the inverters G18, G19, G20. Therefore until the delay time by the inverters G18, G19, G20 is over, the output of the NOR gate G25, that is, the node N2, is at "H". Herein, since both bar CAS signal and bar WE signal are "L", the outputs of the inverters G21 and G22 are both "H".

Incidentally, the potential of the address pin A<0> is $V_{CC}+3|V_{THP}|$ or more, and hence the P type MOSFETs Q19, Q20, Q21 connected in series conduct, and the potential of the node N1 becomes "H". Therefore, the output of the NAND gate G26, that is, the potential of the node N3, becomes "L" for a specific period, and the signal $\phi 1$ becomes "H". On the other hand, the output of the NAND gate G27 is "H".

Herein, the NAND gates G28 and G29 constitute a reset/set flip-flop, and it is set when the potential of the node N3 becomes "L" for a specific period, and the output of the NAND gate 29, that is, the bar TEST signal, becomes "L".

When the bar TEST signal becomes "L", in the "L" period of the bar CAS signal, the signal φ2 is "H".

<B-2. Cycle 2>

In cycle 2 of the bar RAS signal, when the bar RAS signal is changed to "L", and when the bar CAS signal is changed to "L", the potential of the address pins A<0> to A<12> is "L". At the same time, the bar WE signal becomes "L", and the write cycle is specified. Therefore, in this cycle, the "H" data applied to the DQ pin is written in the memory cell selected by the row address (A<0> to A<12>), and column address (A<0> to A<12>).

<B-3. Cycle 3>

In cycle 3 of the bar RAS signal, when the bar RAS signal is changed to "L", and when the bar CAS signal is changed to "L", the potential of the address pins A<0> to A<12> is "L". At the same time, the bar WE signal becomes "H", and the read cycle is specified. Therefore, the data is read out from the memory cell in which "H" is written in the preceding cycle.

The data of the memory cell read out into the I/O wire pair (I/O wire and bar I/O wire) is amplified in the differential amplifier DF in the read circuit 10, and the read data Dr becomes "H". In cycle 3, since the bar WE signal is "H", it is the read cycle, but the bar TEST signal is "L", and therefore "H" is given to one input of the NOR gate G32 of the OEM signal generating circuit GC shown in FIG. 5, and whatever the other input may be, the output of the NOR gate G32 is "L", and the output of the NAND gate G35 is "H", and hence the OEM signal is "L".

When the OEM signal is "L", the outputs of the NAND gates G4 and G5 of the output buffer 13 shown in FIG. 2 are "H" whatever the other input may be. To the gate electrodes of the N type MOSFETs Q11 and Q12, the outputs of the NAND gates G4 and G5 are given through the inverters G2 and G3, and hence the N type MOSFETs Q11 and Q12 are both in non-conductive state, while the output buffer 13 is set in high impedance state.

Therefore, in cycle 3, the expected value De of the data being readout from the tester 80 can be given to the DRAM chip M100 through the DQ pin.

The expected value holding circuit 12 has a latch circuit composed of inverters G6 and G7, and the expected value De of the read data given to the DQ pin is transferred to the latch circuit in the "H" period of the signal φ2. The expected value De of the read out outputted from the latch circuit is given to the comparator 11, and is compared with the read data Dr outputted from the read circuit 10.

Herein, for the expected value De of "H", when the read data Dr is "H", it is normal action, and the comparative result Dt outputted from the comparator 11 is "H". In the event of wrong action due to some cause, however, when the read data Dr is "L", the comparative result Dt is "L".

The comparative result Dt is given to the comparative result holding circuit 14 shown in FIG. 3, and an N type MOSFET Q14 is provided at the inlet part of the comparative result holding circuit 14. To the gate electrode of the N type MOSFET Q14, a signal φ4 becoming "H" for the portion of the delay time by the inverters G37, G38, G39 connected in series shown in FIG. 4 is applied when the bar OE signal becomes "L".

The comparative result Dt is transferred to a latch circuit composed of inverters G14 and G15 of the comparative result holding circuit 14 in the "H" period of the signal φ4. The output (FAIL signal) of the latch circuit is reset to "L" through the N type MOSFET Q15 by the signal φ1 which is "H" for a specific period when getting in the test mode, and is set to "H" when the comparative result Dt is "L", that is, due to onset of wrong action.

<B-4. Cycle 4>

In cycle 4, the end of test mode is specified. When the bar RAS signal is changed to "L", by setting the bar CAS signal to "L" and the potential of the address signal pin A<0> to $V_{CC}+3|V_{THP}|$ or more, in the test control circuit TC shown in FIG. 4, node N1 becomes "H", and the output of the NAND gate G27 becomes "L" for the portion of the delay time by the inverters G18, G19, G29 from the moment the bar RAS signal is changed to "L". Therefore, the bar TEST signal which is the output of the reset/set flip-flop composed of the NAND gates G28 and G29 becomes "H", and the signal φ3 becomes "H" for the portion of the delay time by the inverters G18, G19, G20.

In the event of a wrong action during test mode period (corresponding to the period of cycles 2, 3 in FIG. 7 and FIG. 8), since the FAIL signal is "H" as mentioned above, when the signal φ3 becomes H, the N type MOSFETs Q16 and Q17 of the comparative result holding circuit 14 shown in FIG. 3 will conduct. Herein, by using a large transistor size in the N type MOSFETs Q16 and Q17, a large current flows from the power source potential $V_{CC}$ to the grounding potential $V_{SS}$, and the fuse F1 is melted. As a result, in the route from the drain electrode of the N type MOSFET Q16 to the inverter G16, that is, in the route for outputting the comparative result Dt as GOOD signal as test result signal (hereinafter called PASS line), the potential is discharged through the resistance element R1, and hence becomes "L". Therefore, the GOOD signal as the test result signal of the comparative result holding circuit 14 is "L". Herein, when the potential of the PASS line becomes "L", the N type MOSFET Q18 conducts, and a route connected to the grounding potential is formed through the N type MOSFET Q18, and this is a constitution for enhancing the noise resistance of the GOOD signal.

If wrong action does not occur in the test mode period, the FAIL signal is "L", and hence the N type MOSFET Q16 does not conduct, and if the signal φ3 becomes "H", current does not flow through the N type MOSFET Q16 and N type MOSFET Q17. At this time, the current flowing from the power source potential $V_{CC}$ through the fuse F1 is limited by the resistance element R1, and hence the fuse F1 is not melted. Therefore, the PASS line remains charged to "H" through the fuse element F1 from the power source potential $V_{CC}$. Therefore, the GOOD signal which is the output of the comparative result holding circuit 14 is "H".

Herein, the time spent for such series of parallel test action is about 3 seconds, for example, when testing 100 DRAM chips M.

<C. Individual judging action>

In this way, after parallel test of n DRAM chips M by using the tester 80, the power source is once turned off to change over to the ordinary mode, and the individual DRAM chips M1 to Mn are checked for wrong action by the tester 80 (hereinafter called individual judging).

Figure 9:
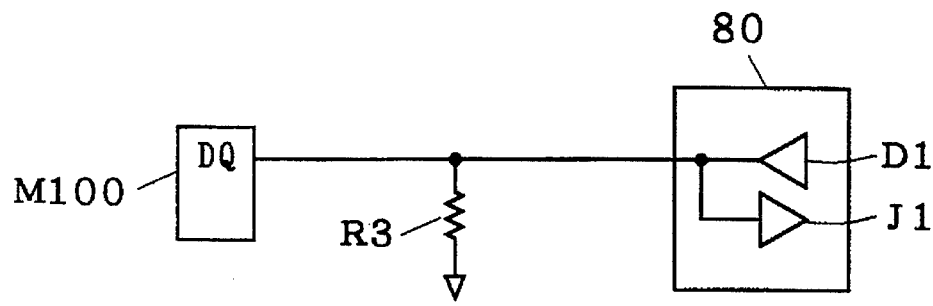
FIG. 9 is a structural diagram for individual judgement according to the first preferred embodiment of the semiconductor memory device of the invention.

FIG. 9 shows the constitution for checking the DRAM chip M100 for wrong action by using the tester 80. In FIG. 9, the route linking the input and output end of the tester 80 and the DQ pin of the DRAM chip M100 is connected to the grounding potential through the resistance element R3.

Figure 10:
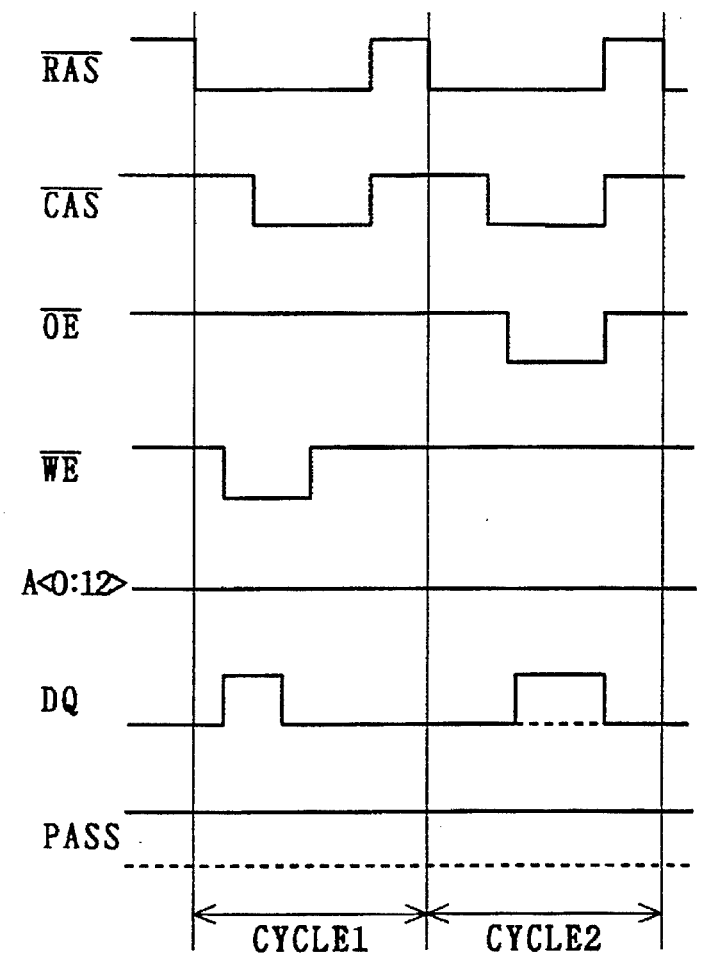
FIG. 10 is a timing chart for individual judgement according to the first preferred embodiment of the semiconductor memory device of the invention.

The timing chart for checking the action of the DRAM chip M100 is shown in FIG. 10. Cycle 1 of bar RAS signal shown in FIG. 10 is the write cycle, and cycle 2 is the read cycle. In FIG. 10, the broken line indicates the operation with a wrong action, and the solid lines shows a normal operation.

The action of the write circuit 15 shown in FIG. 2 is described below. In FIG. 2, a write circuit activating signal φw given from the control circuit 1 is a signal which becomes "H" when the bar CAS signal and bar WE signal are "L", and when reading, the write circuit activating signal φw becomes "L". When the write circuit activating signal φw is "L", that is, when reading, the P type MOSFET Q30 and N type MOSFET Q32 are both in non-conductive state, and the connection node of the two is in a high impedance state. The P type MOSFET Q31 and N type MOSFET Q33 are also both in a non-conductive state, and the connection node of the two is in a high impedance state.

When writing, on the other hand, the write circuit activating signal φw is "H", and when the write data given from the DQ pin is "H", the potential of the I/O wire is "H" and the potential of the bar I/O wire is "L". To the contrary, when the write data is "L", the potential of the I/O wire is set to "L", and the potential of the bar I/O wire, "H".

<C-1. Cycle 1>

Therefore, in cycle 1 of the bar RAS signal shown in FIG. 10, in the "L" period of the bar CAS signal and bar WE signal, the write data given from the DQ pin is written, and the write data given from the DQ pin at this time is "H".

<C-2. Cycle 2>

Next, in cycle 2, the written data is read out. In the DRAM chip M100 causing wrong action during test mode period, the fuse F1 of the comparative result holding circuit 14 shown in FIG. 3 is melted, and hence the route connected to the power source potential $V_{CC}$ is cut off, and the potential of the PASS line is at the grounding potential through the resistance element R1. Therefore, the output of the inverter G17, that is, the GOOD signal, is "L", and the outputs of the NAND gates G4 and G5 of the output buffer 13 are "H", and the output buffer 13 remains in a high impedance state also in cycle 2. Therefore, the potential of the DQ pin becomes the grounding potential through the resistance element R3.

On the other hand, in the DRAM chip M100 not causing wrong action during the test mode period, since the fuse F1 of the comparative result holding circuit 14 is not melted, the route connected to the power source potential $V_{CC}$ is held, and the PASS line remains at "H", and the GOOD signal becomes "H", and the data "H" written in cycle 1 is read out from the output buffer 13.

In this way, depending on whether the fuse F1 is melted or not, the comparative result is held in a non-volatile manner, and by confirming whether the potential of the DQ pin is "H" or the grounding potential by the data judging circuit J1, presence or absence of wrong action can be detected.

When individual judging of one DRAM chip M is over, the judged DRAM chip M and the tester 80 are disconnected, and the next DRAM chip M is connected, and is judged individually in the same manner. Therefore, with n DRAM chips, individual judging action is done n times.

The time spent for individual judging action is about 0.5 seconds, and, for example, 100 DRAM chips M can be judged individually in about 50 seconds.

<D. Action and effect>

As described herein, since the semiconductor memory device of the invention incorporates the test mechanism, the parallel test can be done by the inexpensive tester having only one data judging circuit, and then the comparative result is judged individually by using the same tester, so that the qualification of the semiconductor memory device can be judged without lowering the through-put.

In the above explanation, it was an example of parallel test in the test mode period in two cycles of cycle 2 and cycle 3 of bar RAS signal, but the test mode period is not limited to two cycles, and the test mode period may be set in an arbitrary number of cycles.

<Second Preferred Embodiment>

<E. Device constitution>

In the first preferred embodiment of the semiconductor memory device of the invention described so far, the comparative result holding circuit 14 has a fuse F1 which melts down reflecting the result of comparison, but a floating gate transistor may be used instead of the fuse F1. The DRAM chip M100A using a floating gate transistor in the comparative result holding circuit is described below.

Figure 11:
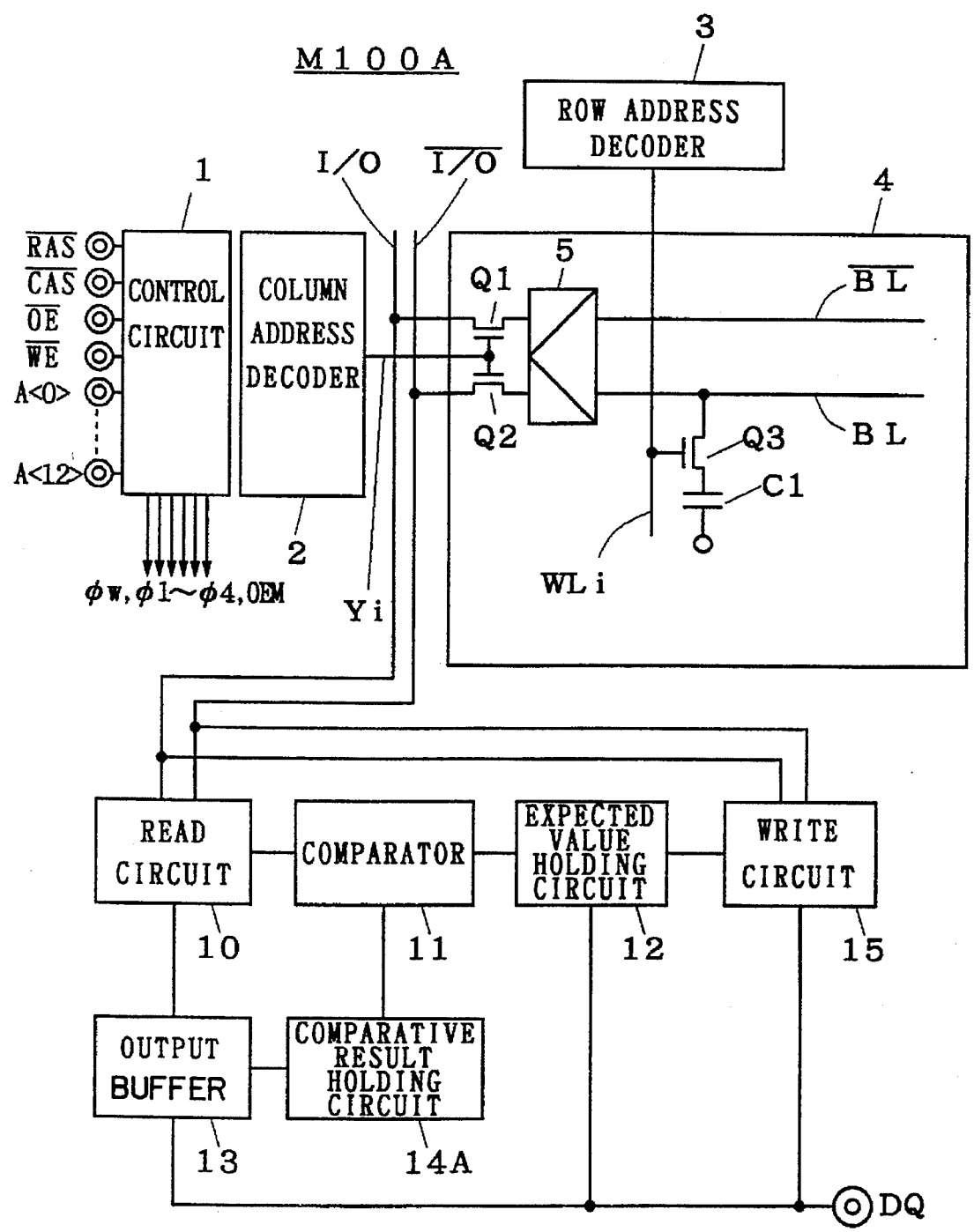
FIG. 11 is a block diagram explaining the constitution of a second preferred embodiment of a semiconductor memory device of the invention.

FIG. 11 shows the constitution of the DRAM chip M100A. Herein, the same parts as in the constitution of the DRAM chip M100 explained in FIG. 1 are identified with same reference numerals, and repeated explanations are omitted. In FIG. 11, only the comparative result holding circuit 14A is different, and the following explanation relates to the comparative result holding circuit 14A alone.

<E-1. Comparative result holding circuit>

Figure 12:
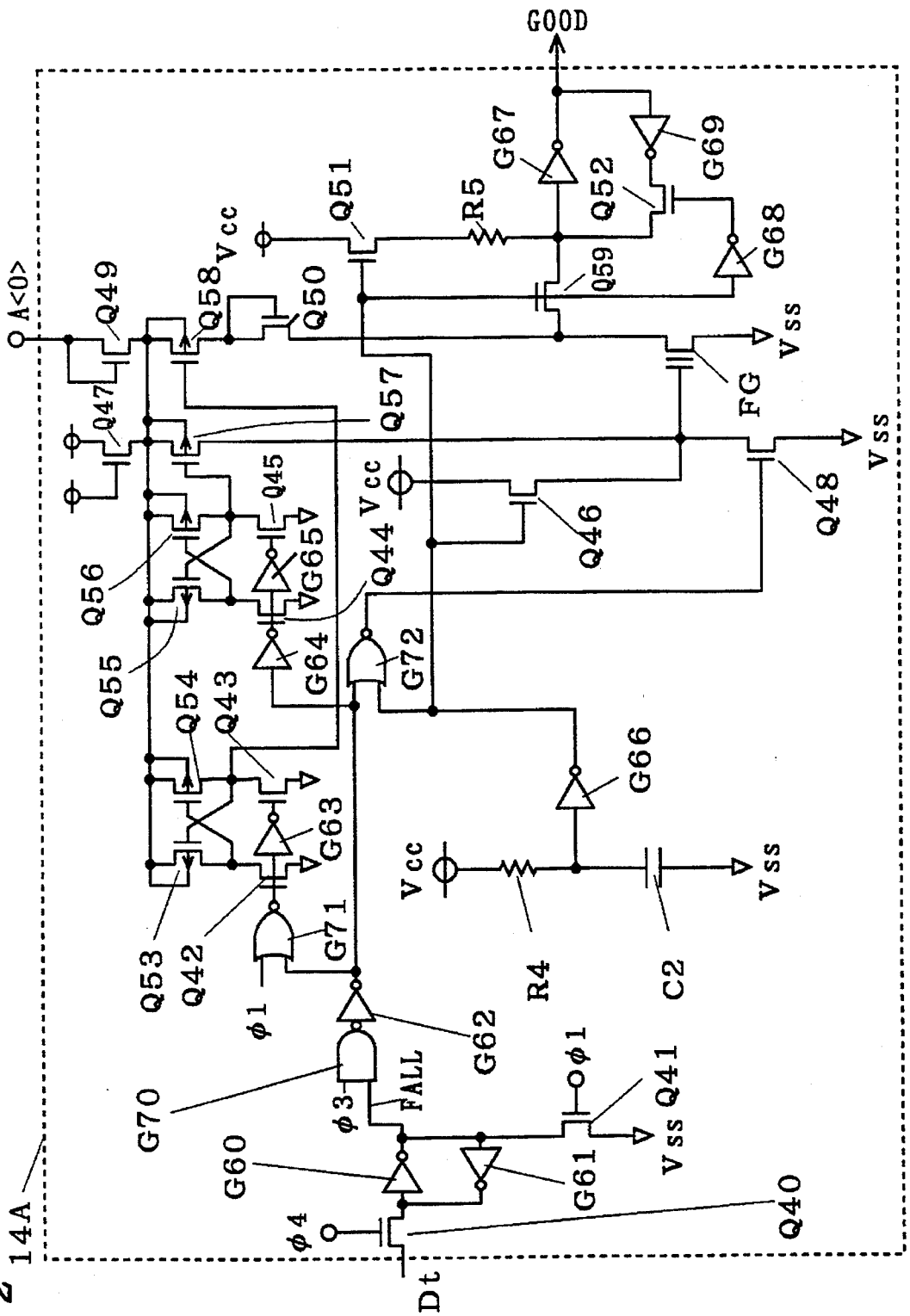
FIG. 12 is a circuit diagram explaining the constitution of a test result holding circuit according to the second preferred embodiment of the invention.

First, the constitution is described by referring to FIG. 12 showing the circuit diagram of the comparative result holding circuit 14A. In FIG. 12, the comparative result holding circuit 14A comprises inverters G60 to G69, NAND gate G70, NOR gates G71 and G72, N type MOSFETs Q40 to Q52, P type MOSFETs Q53 to Q59, N type floating gate transistor FG, resistance elements R4 and R5, and capacitor C2.

The output Dt of the comparator circuit 11 is given to the drain electrode of the N type MOSFET Q40, and the source electrode of the N type MOSFET Q40 is connected to the input of the inverter G60. To the inverter G60, an inverter G61 is connected in a loop form, and the output of the inverter G60 is connected to the drain electrode of the N type MOSFET Q41 and the input of the NAND gate G70. To the gate electrode of the N type MOSFET Q40, a signal φ4 is given from the control circuit 1, and a signal φ1 is given to the gate electrode of the n type MOSFET Q41, and the source electrode is connected to the grounding potential $V_{SS}$. To one input of the NAND gate G70, signal φ3 is given from the control circuit 1.

An inverter G62 is connected to the output of the NAND gate G70, and the output of the inverter G62 is connected to the inputs of the NOR gates G71 and G72, and is also connected to the inverter G64.

The P type MOSFET Q53 and N type MOSFET Q42, and the P type MOSFET Q54 and N type MOSFET Q43 are connected in series both, and the N type MOSFETs Q42 and Q43 are connected to the grounding potential. The output of the NOR gate G71 is connected to the gate electrode of the N type MOSFET Q42, and is also connected to the inverter G63, and the output of the inverter G63 is also connected to the gate electrode of the N type MOSFET Q43. The connection node of the P type MOSFET Q53 and N type MOSFET Q42 is connected to the gate electrode of the P type MOSFET Q43, and the connection node of the P type MOSFET Q43 and N type MOSFET Q43 is connected to the gate electrode of the P type MOSFET Q53, and is also connected to the gate electrode of the P type MOSFET Q58.

The P type MOSFET Q55 and N type MOSFET Q44, and the P type MOSFET Q56 and N type MOSFET Q45 are connected in series both, and the N type MOSFETs Q44 and Q45 are connected to the grounding potential. The output of the inverter G64 is connected to the gate electrode of the N type MOSFET Q44, and is also connected to the inverter G65, and the output of the inverter G65 is also connected to the gate electrode of the N type MOSFET Q45. The connection node of the P type MOSFET Q55 and N type MOSFET Q44 is connected to the gate electrode of the P type MOSFET Q56, and the connection node of the P type MOSFET Q56 and N type MOSFET Q45 is connected to the gate electrode of the P type MOSFET Q55, and is also connected to the gate electrode of the P type MOSFET Q57.

Between the power source potential $V_{CC}$ and grounding potential $V_{SS}$, the resistance element R4 and capacitor C2 are connected in series, and the inverter G66 is connected to the connection node of the two, and the output of the inverter G66 is connected to the NOR gate G72.

The N type MOSFET Q47, P type MOSFET Q57, and N type MOSFET Q48 are connected in series between the power source potential $V_{CC}$ and the grounding potential $V_{SS}$, and the output of the NOR gate G72 is connected to the gate electrode of the N type MOSFET Q48. Herein, the gate electrode of the N type MOSFET Q47 is connected to the power source potential $V_{CC}$.

Herein, to the drain electrode of the N type MOSFET Q48, the source electrode of the N type MOSFET Q46 having the drain electrode connected to the power source potential $V_{CC}$ is connected, and the gate electrode of the N type MOSFET Q46 is connected to the output of the inverter G66.

The N type MOSFET Q49, P type MOSFET Q58, N type MOSFET Q50, and N type floating gate transistor FG (route cut-off element) are connected in series between the address signal pin A<0> and grounding potential $V_{SS}$, and the drain electrode of the N type MOSFET Q48 is also connected to the gate electrode of the N type floating gate transistor FG. Herein, the gate electrode of the N type MOSFET Q49 is connected to the address signal pin A<0>, and the gate electrode of the N type MOSFET Q49 is connected to the drain electrode. To the connection node of the N type MOSFET Q49 and P type MOSFET Q58, the source electrodes of the P type MOSFETs Q53 to Q57 are commonly connected. The back gates of the P type MOSFETs Q53 to Q58 are connected to the respective source electrodes.

The drain electrode of the N type floating gate transistor FG is connected to the source electrode of the N type MOSFET Q59, and the drain electrode of the N type MOSFET Q59 is connected to the inverter G67, and the output of the inverter G67 is a GOOD signal. The output of the inverter G67 is connected to the inverter G69, and the output of the inverter G69 is connected to the source electrode of the N type MOSFET Q52, while the drain electrode of the N type MOSFET Q52 is connected to the input of the inverter G67.

The source electrode of the N type MOSFET Q51 having the drain electrode connected to the power source potential $V_{CC}$ is connected to one end of the resistance element R5, and the other end of the resistance element R5 is connected to the input of the inverter G67. The gate electrode of the N type MOSFET Q51 is connected to the output of the inverter G66, and is also connected to the gate electrode of the N type MOSFET Q59 and input of the inverter G68, and the output of the inverter G68 is connected to the gate electrode of the N type MOSFET Q52.

<F. Parallel test action>

Referring to FIG. 12 and the timing charts shown in FIGS. 7 and 8, the action of the comparative result holding circuit 14A is described. In a specific time after turning on the power source, the capacitor C2 is charged, and the input potential of the inverter G66 becomes "H", and the output side potential of the inverter G66 becomes "L".

<F-1. Cycle 1>

In cycle 1 of bar RAS signal shown in FIGS. 7 and 8, the potential of the address signal pin A<0> is set over $V_{CC}$+ $3|V_{THP}|$, but the signal $\phi 1$ is "H" for a specific period, the output of the NOR gate G71 is "L", and the N type MOSFET Q43 conducts, and the potential at the connection node with the P type MOSFET Q54 is "L", and the P type MOSFET Q58 conducts, so does the N type MOSFET Q50, and thereby the potential at the source side of the N type MOSFET Q50 becomes "H".

Besides, the signal $\phi 3$ is "L", and the output of the NAND gate G70 is "H", and the output of the inverter G62 is "L". In this case, the output of the inverter G64 is "H", and the P type MOSFET Q56 conducts along with the conduction of the N type MOSFET Q44, and the potential at the connection node with the N type MOSFET Q45 becomes "H". The output of the NOR gate G72 is "H", and the P type MOSFET Q57 does not conduct and the N type MOSFET Q48 conducts, so that the drain electrode side potential of the N type MOSFET Q48 becomes "L".

Therefore, electrons of the floating gate of the N type floating gate transistor FG run through to the drain electrode side, and the threshold value of the N type floating gate transistor FG becomes a low value and is initialized.

<F-2. Cycle 3>

Same as in the comparative result holding circuit 14 explained by reference to FIG. 3, when the signal $\phi 1$ becomes "H" for a specific period in cycle 1, the latch circuit composed of the inverters G60 and G61 is reset, and the output (FAIL signal) of the latch circuit becomes "L". In cycle 3, at the timing of the signal $\phi 4$ becoming "H", it is transferred to the latch circuit composed of inverters G60 and G61 of the comparative result holding circuit 14A. The FAIL signal is set to "H" when the comparative result Dt becomes "L", that is, by the onset of wrong action.

<F-3. Cycle 4>

In cycle 4, the potential of the address signal pin A<0> is set over $V_{CC}+3|V_{THP}|$, and the bar CAS signal is set to "L" ahead of the bar RAS signal, so that the comparative result is held in the comparative result holding circuit 14A.

That is, in the case of FAIL signal being "H", when the signal $\phi 3$ becomes "H", the output of the NAND gate G70 becomes "L", and the output of the inverter G62 becomes "H". In this case, the output of the NOR gate G70 becomes "L", and the output of the inverter G63 becomes "H", and the N type MOSFET Q43 conducts, and the potential of the connection node with the P type MOSFET Q54 becomes "L".

Besides, the output of the inverter G62 is "H", and hence the output of the inverter G64 becomes "L" and the output of the inverter G45 becomes "H", and the N type MOSFET Q45 conducts, so that the potential of the connection node with the P type MOSFET Q56 becomes "L". Moreover, since the output of the NOR gate G72 is "L", the P type MOSFETs Q57 and Q58 conduct, and the N type MOSFET Q48 does not conduct, and the drain electrode side potential of the N type MOSFET Q48 is lowered from the potential of the address signal pin A<0> due to ON resistance of the N type MOSFET Q50, and hence the power source potential $V_{CC}$ becomes higher, and the drain electrode side potential of the N type floating gate transistor is nearly at the potential of the address signal pin A<0>.

Therefore, electrons are injected into the floating gate of the N type floating gate transistor FG, and the threshold value of the N type floating gate transistor FG is heightened.

When the FAIL signal is "L", that is, in the absence of wrong action, if the signal φ3 becomes "H", the potential of the connection node of N type MOSFET Q43 and P type MOSFET Q54 is "H", the potential of the connection node of P type MOSFET Q56 and N type MOSFET Q45 is "H", and the output of the NOR gate G72 is "H", and hence the P type MOSFETs Q57 and Q58 do not conduct, while the N type MOSFET Q48 conducts, and therefore the drain electrode side potential of the N type floating gate transistor FG is "L" and the threshold value of the N type floating gate transistor FG remains low. That is, depending on whether the N type floating gate transistor FG is capable of ON action or not, the comparative result is held in a non-volatile manner.

<G. Individual judging action>

Once the power source is cut off, and when the power source is turned on again in order to judge individually by using the tester 80, the capacitor C2 is not charged until a specific time has passed, and the input side potential of the inverter G66 remains at "L". Therefore, the output side potential of the inverter G66 is "H" until the input side potential of the inverter G66 becomes higher than the threshold value of the inverter G66.

When the output side potential of the inverter G66 is "H", the output of the NOR gate G72 is "L", and the N type MOSFET Q48 does not conduct. Consequently, the N type MOSFETs Q46 and Q51 conduct. Herein, when the threshold value of the N type floating gate transistor FG is low (in the absence of wrong action), the N type floating gate transistor FG is turned on, and the route to be connected to the grounding potential $V_{SS}$ is held, and hence the drain electrode side potential of the N type floating gate transistor FG becomes "L", so that the GOOD signal becomes "H".

On the other hand, when the threshold value of the N type floating gate transistor FG is high (in the presence of wrong action), the N type floating gate transistor FG is not turned on, and the route connected to the grounding potential $V_{SS}$ is cut off. As a result, the drain electrode side potential of the N type floating gate transistor FG becomes "H", and the GOOD signal becomes "L", and hence the outputs of the NAND gates G4 and G5 of the output buffer 13 explained in FIG. 2 become "H", and the N type MOSFETs Q11 and Q12 do not conduct, and the output buffer 13 remains in a high impedance state. Therefore, the potential of the DQ pin becomes a grounding potential through the resistance element R3 shown in FIG. 9, so that the occurrence of wrong action in the DRAM chip M100A is known.

In a specific time after the power source is turned on, the capacitor C2 is charged, and the input side potential of the inverter G66 becomes "H", and the output side potential of the inverter G66 becomes L. When the output side potential of the inverter G66 becomes "L", the N type MOSFETs Q46, Q51, Q59 do not conduct, while the N type MOSFET Q52 conducts, and a latch circuit is composed of the inverters G67 and G69, and the immediately preceding GOOD signal is held.

<H. Action and effect>

As explained herein, by using the floating gate transistor instead of the fuse which is melted by overcurrent, the comparative result holding circuit can be composed. Thus, use of floating gate transistor as a route cut-off element is advantageous in simplifying the manufacturing process because the floating gate transistor can be formed in the process of forming the memory cell array, as compared with the case of using a fuse element as a route cut-off element.

<I. Modified example>

In the N type floating gate transistor FG of the comparative result holding circuit 14A explained with reference to FIG. 12, the floating gate transistor for so-called EEPROM capable of electrically easing the memory content is used, but the floating gate transistor for so-called EPROM for erasing the memory content by irradiation with ultraviolet ray may be also used. In this case, instead of the initialization action in cycle 1 of the bar RAS signal shown in FIG. 7 and FIG. 8, the irradiation action of ultraviolet ray is required.

<Third Preferred Embodiment>

In the first and second preferred embodiments of the semiconductor memory device of the invention described so far, in the individual test using the tester 80, presence or absence of wrong action is judged when the DQ pin of the DRAM chip M100 causing wrong action is set in high impedance state also in the read cycle, but it may be directly judged by the GOOD output of the comparative result holding circuit 14 or 14A.

<J. Device constitution>

That is, a wrong action indication circuit for indicating occurrence of wrong action by performing an abnormal action in ordinary mode by receiving a GOOD output of the comparative result holding circuit 14 or 14A is further provided in the DRAM chip M100 or 100A.

<J-1. Wrong action indicating circuit>

Figure 13:
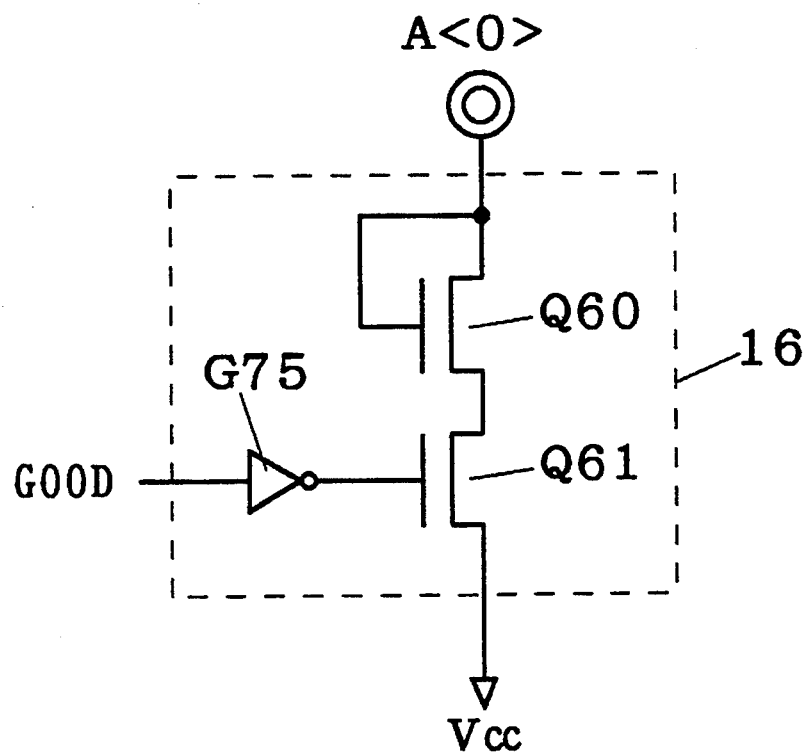
FIG. 13 is a circuit diagram explaining the constitution of a wrong action indicating circuit in a third preferred embodiment of a semiconductor memory device of the invention.

An example of a wrong action indicating circuit is shown in FIG. 13. In FIG. 13, the wrong action indicating circuit 16 possesses N type MOSFETs Q60 and Q61 connected in series between the address signal pin A<0> and grounding potential $V_{SS}$, and the gate electrode of the N type MOSFET Q60 is connected to the address signal pin A<0>, and the GOOD output of the comparative result holding circuit 14 is fed into the inverter G75, and the output of the inverter G75 is connected to the gate electrode of the N type MOSFET Q60.

In thus constituted wrong action indicating circuit 16, when the GOOD output of the comparative result holding circuit 14 is "L", that is, in the presence of wrong action, the N type MOSFET Q61 conducts, and a current flows between the address signal pin A<0> and grounding potential $V_{SS}$. On the other hand, when the GOOD output is "H", that is, in the absence of wrong action, current does not flow between the address signal pin A<0> and grounding potential $V_{SS}$, and therefore by checking for presence or absence of current, presence or absence of wrong action can be judged.

Figure 14:
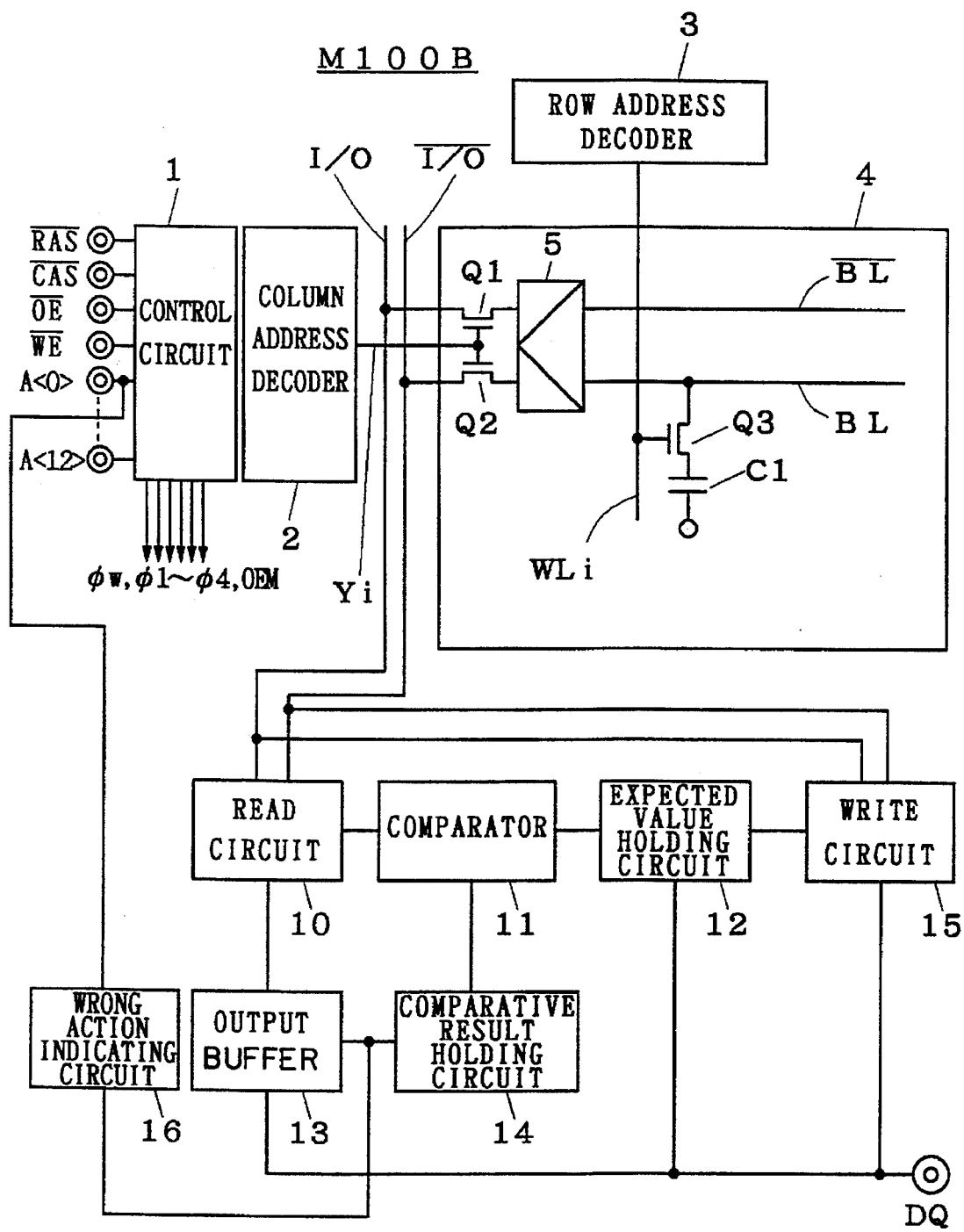
FIG. 14 is a block diagram explaining the constitution of the third preferred embodiment of the semiconductor memory device of the invention.

FIG. 14 shows the constitution of the DRAM chip M100B having the wrong action indicating circuit 16. In FIG. 14, the wrong action indicating circuit 16 is inserted between the address signal pin A<0> and grounding potential $V_{SS}$, and the GOOD output of the comparative result holding circuit 14 is connected to the wrong action indicating circuit 16, but the other elements are the same as in the constitution of the DRAM chip M100 and duplicate explanations are omitted. Incidentally, the connecting means of the wrong action indicating circuit 16 is not limited to the address signal pin A<0> alone, but any signal terminal may be used such as bar RAS signal terminal and bar CAS signal terminal.

<K. Individual judging action>

Figure 15:
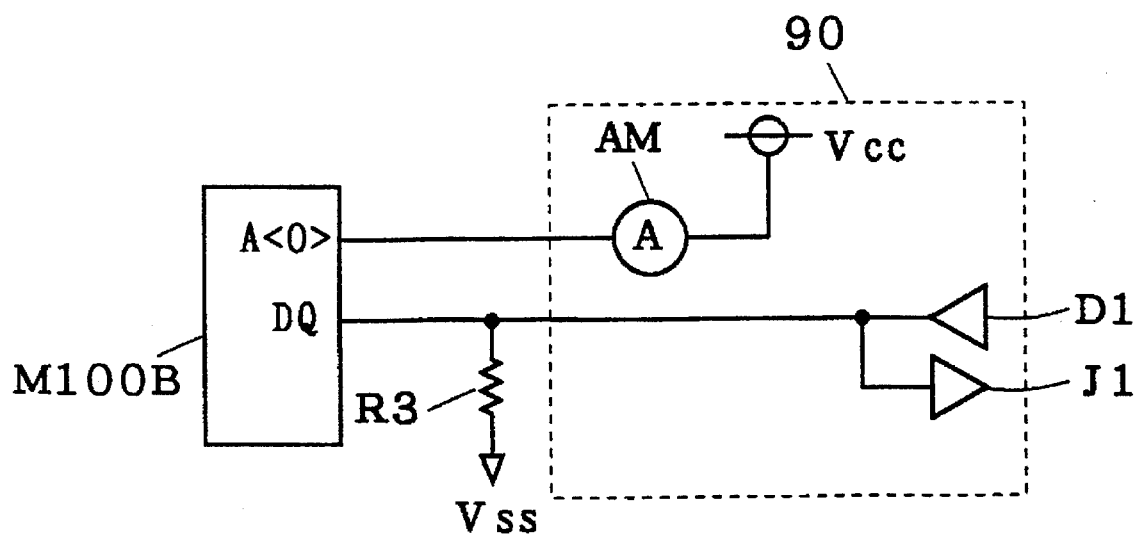
FIG. 15 is a structural diagram for individual judgement according to the third preferred embodiment of the semiconductor memory device of the invention.

To check the action of the DRAM chip M100B in such a constitution, the tester used in individual judging should be provided with an ammeter. FIG. 15 shows a constitution of checking the action of the DRAM chip M100B by using the tester provided with an ammeter In FIG. 15, a tester 90 has an ammeter AM provided in a route connected to the address signal pin A<0>, out of the input and route routes connected to a signal driver D1, and one end of the ammeter AM is connected to the power source potential $V_{CC}$. The others are same as in the tester.

When judged individually by using the tester 90 of such a constitution, when the DRAM chip M100B has a wrong action, the ammeter AM detects the current flowing between the address signal pin A<0> and the grounding potential $V_{SS}$, so that presence or absence of wrong action can be judged.

In the DRAM chip M100B, since the GOOD output of the comparative result holding circuit 14 is connected also to the output buffer 13, presence or absence of wrong action can be judged also by the DQ pin which falls in a high impedance state also in the read cycle.

If, meanwhile, the presence or absence of wrong action is not judged by the output of the DQ pin, the GOOD output of the comparative result holding circuit 14 may not be connected to the output buffer 13, and the three-input NAND gates G4 and G5 of the output buffer 13 can be changed to two-input NAND gates.

<Fourth preferred embodiment>

<L. Device constitution>

In the first to third preferred embodiments of the semiconductor memory device of the invention described so far, the test mechanism is incorporated in the DRAM chip M having the output buffer and write circuit connected commonly to the DQ pin, but the test mechanism may be similarly incorporated in the DRAM chip M in which the output buffer is connected to the data output terminal, or Dout pin, and the write circuit is connected to the data input terminal, or Din pin. Explained below is the DRAM chip M100C incorporating the test mechanism in the DRAM chip M having Dout pin and Din pin.

Figure 16:
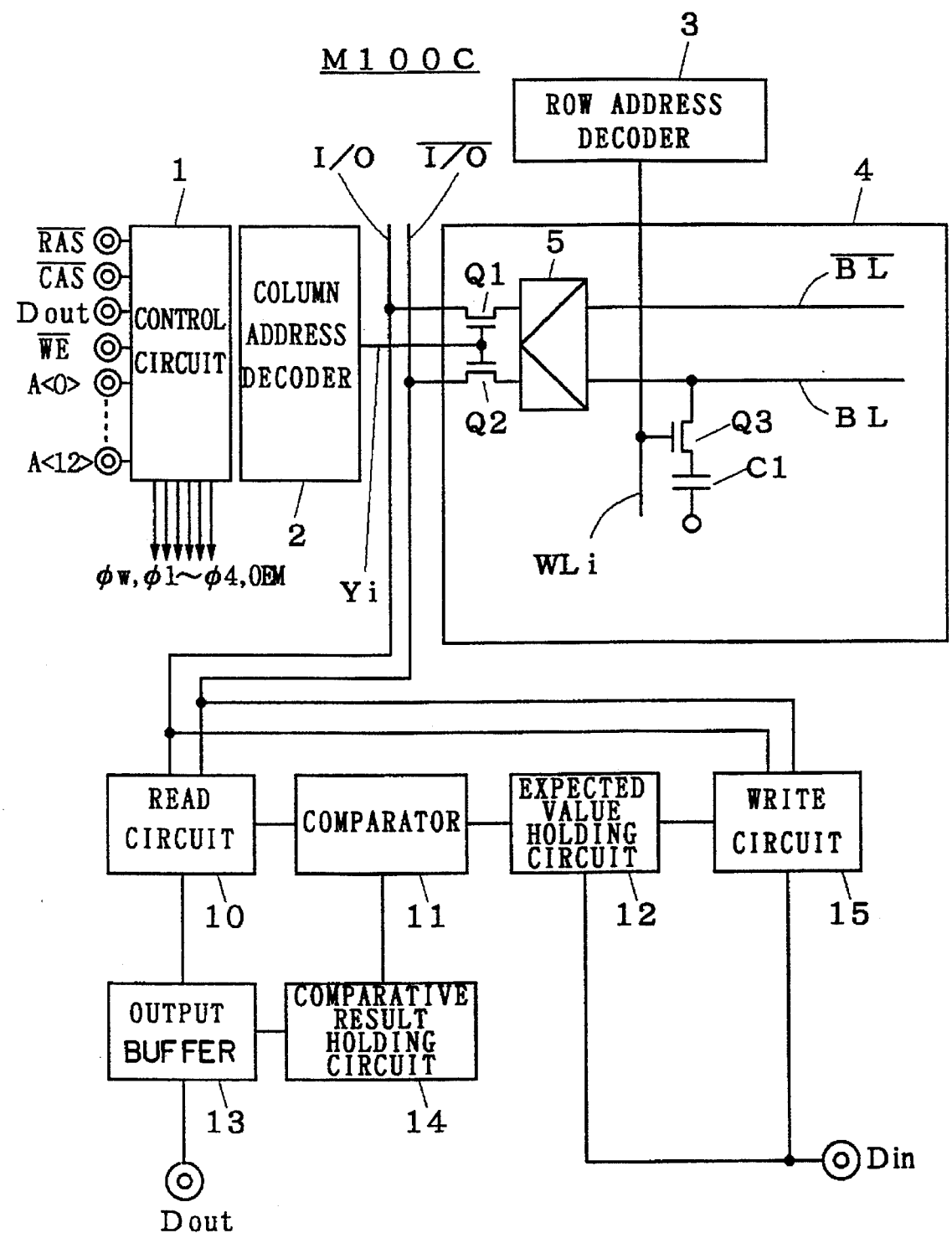
FIG. 16 is a block diagram explaining the constitution of a fourth preferred embodiment of a semiconductor memory device of the invention.
Figure 17:
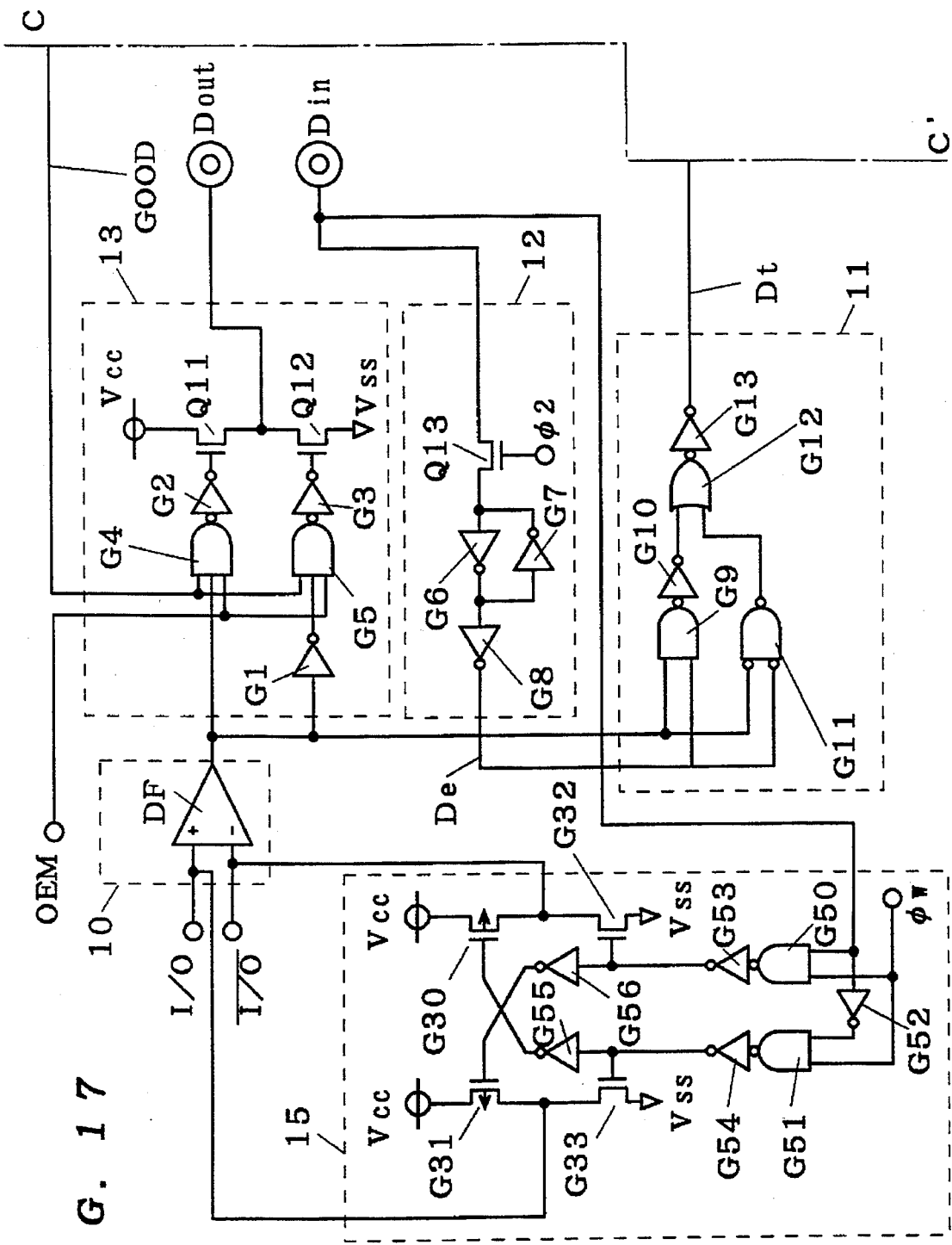
FIG. 17 is a circuit diagram explaining the constitution of the fourth preferred embodiment of the semiconductor memory device of the invention.
Figure 18:
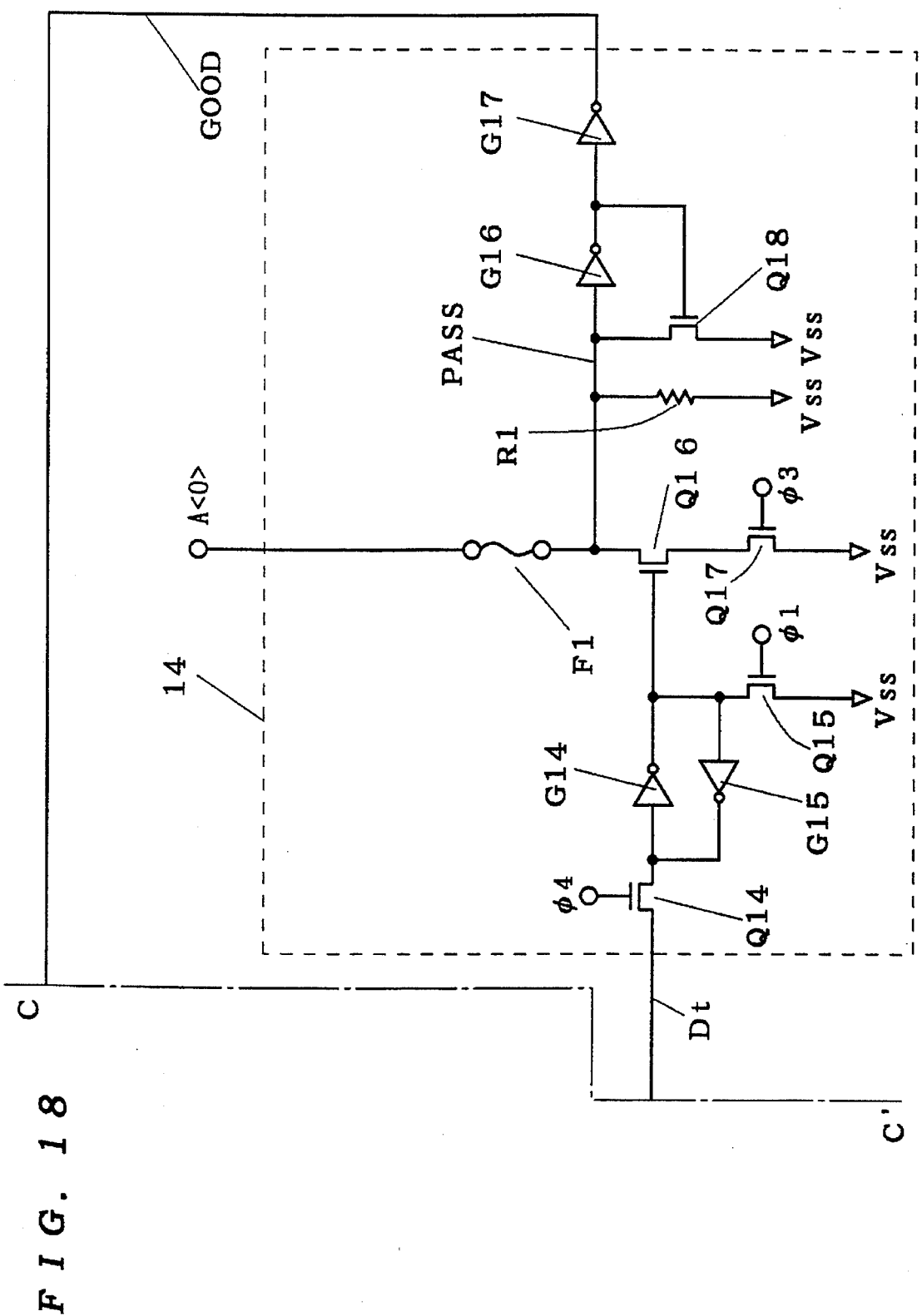
FIG. 18 is a circuit diagram explaining the constitution of the fourth preferred embodiment of the semiconductor memory device of the invention.

FIG. 16 shows the constitution of the DRAM chip M100C. Herein, the same parts as in the DRAM chip M100 explained in FIG. 1 are identified with same reference numerals, and duplicate explanations are omitted. In FIG. 16, the expected value holding circuit 12 and write circuit 15 are connected to the Din pin which is the data input terminal, instead of the DQ pin, and the output buffer 13 is connected to the Dout pin, which is the data output terminal, instead of the DQ pin, and all other elements are the same as in the DRAM chip M100 explained in FIG. 1. FIG. 17 and FIG. 18 show the constitution of the DRAM chip M100C as circuit diagrams. FIG. 17 and FIG. 18 are coupled together along line CC'.

<L-1. OEM signal generating circuit>

Figure 19:
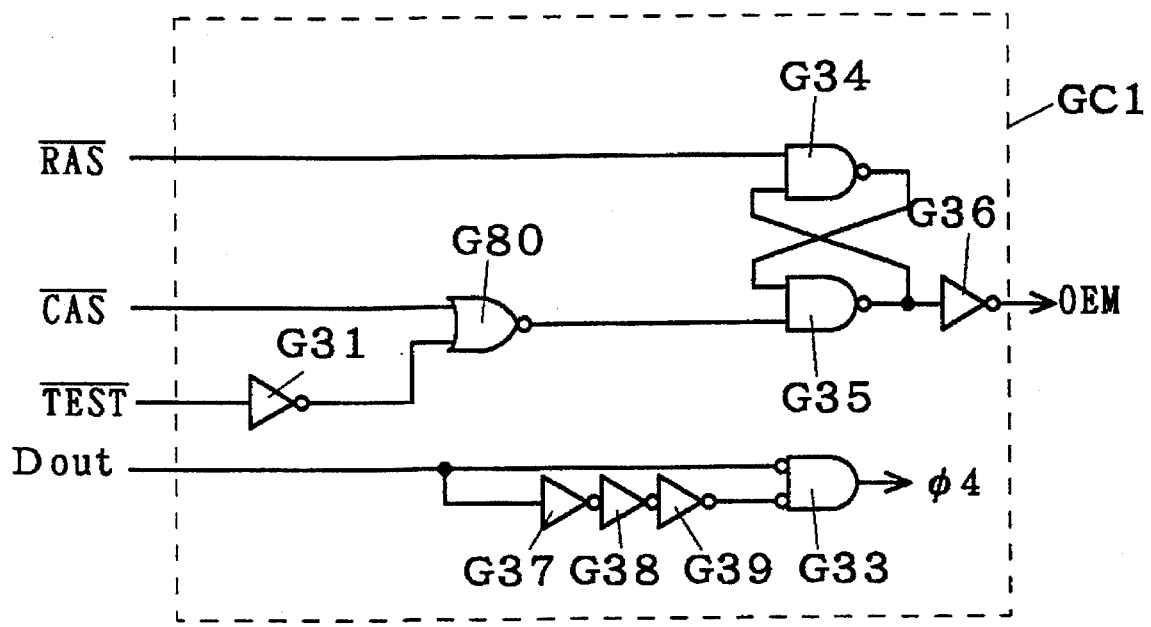
FIG. 19 is a circuit diagram explaining the constitution of OEM signal generating circuit of the fourth preferred embodiment of the semiconductor memory device of the invention.

Herein, the DRAM chip M having Dout pin and Din pin does not require bar OE pin for specifying whether to use the DQ in for input or for output, and therefore the OEM signal generating circuit GC1 for generating OEM signal and φ4 signal is constituted as shown in FIG. 19.

That is, the three-input NOR gate G32 of the OEM signal generating circuit GC explained in FIG. 4 is changed to the two-input NOR gate G80. The other constitution is the same as in the OEM signal generator GC, and duplicate explanations are omitted.

<M. Parallel test action>

Figure 20:
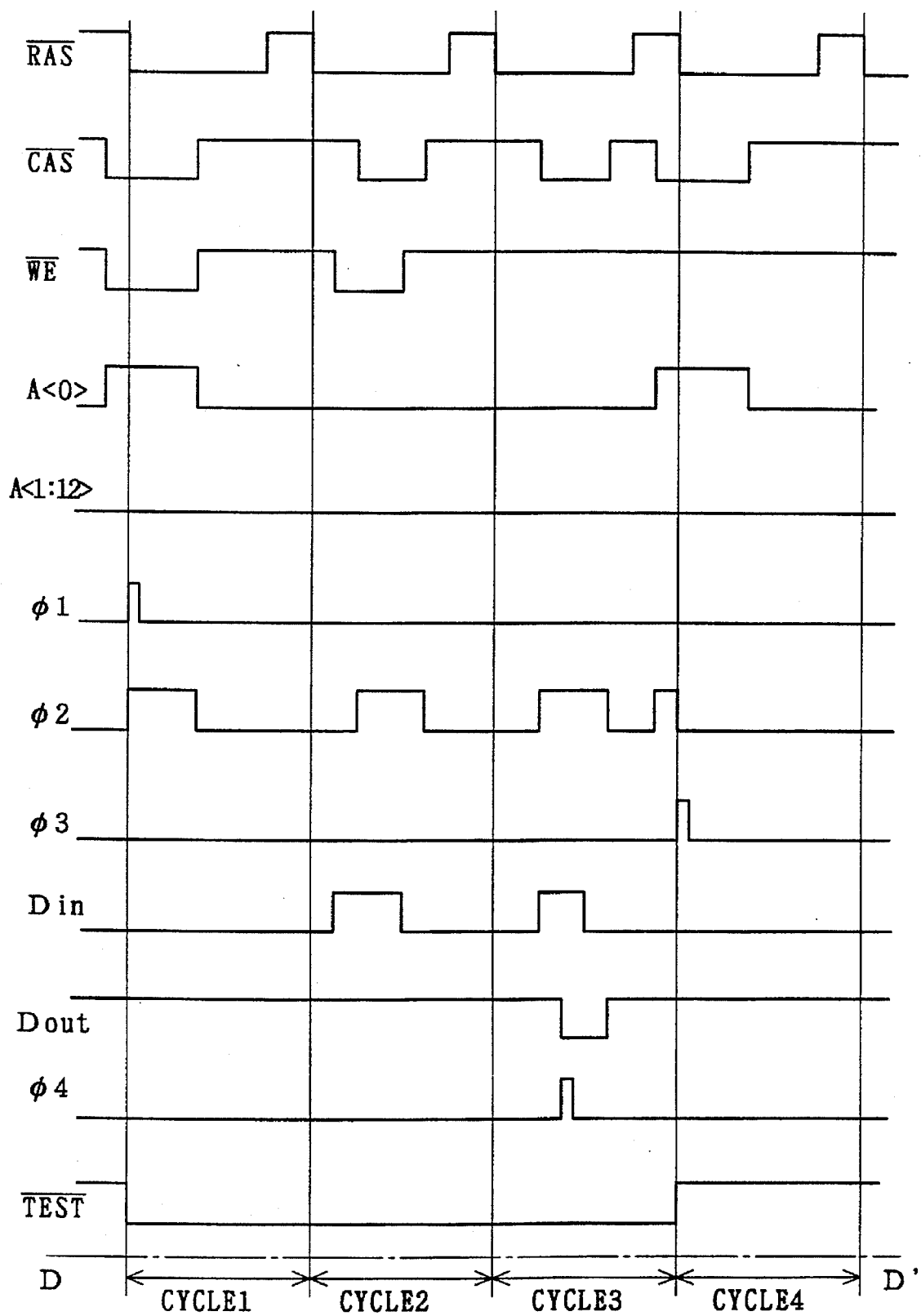
FIG. 20 is a timing chart of parallel test according to the fourth preferred embodiment of the semiconductor memory device of the invention.
Figure 21:
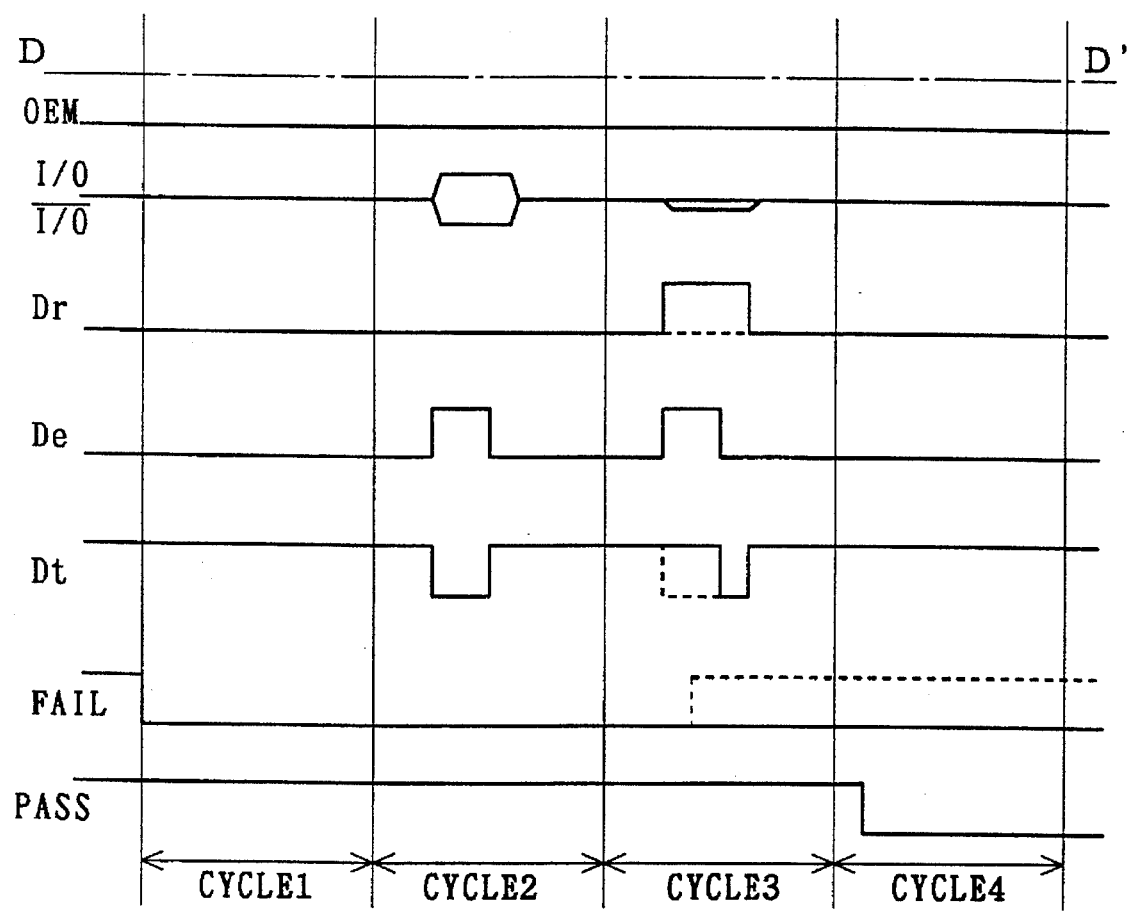
FIG. 21 is a timing chart of parallel test according to the fourth preferred embodiment of the semiconductor memory device of the invention.
Figure 22:
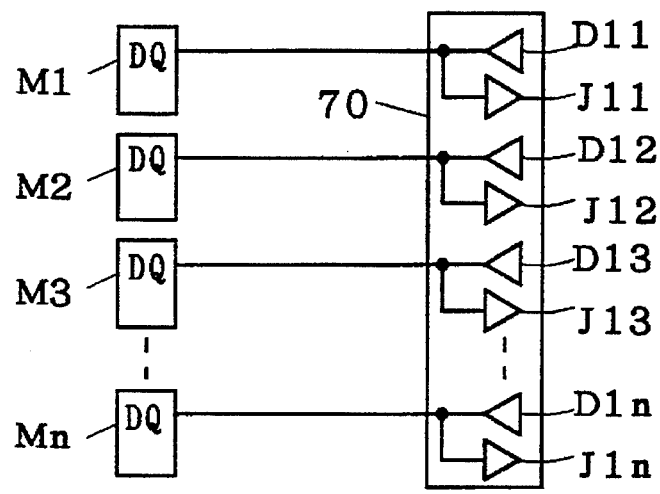
FIG. 22 is a structural diagram of parallel test by using a conventional semiconductor memory device.

The test action of the DRAM chip M100C is explained by referring to the timing charts shown in FIG. 20 and FIG. 21, relating to a parallel test. FIG. 20 and FIG. 21 are coupled together along line DD'.

In FIG. 20 and FIG. 21, the start and end of test mode, that is, cycle 1 and cycle 4 of bar RAS signal are same as in the test action of the DRAM chip M100 explained in FIG. 6, and hence duplicate explanations are omitted.

<M-1. Cycle 2>

In cycle 2 of bar RAS signal shown in FIG. 20 and FIG. 21, when the bar RAS signal is changed to "L" and when the bar CAS signal is changed to "L", the potential of the address pins A<0> to A<12> is "L". When the bar WE signal becomes "L", the write cycle is specified. In this cycle, therefore, the "H" data applied to Din pin is written in the memory cell selected by the row address (A<0> to A<12>) and column address (A<0> to A<12>).

<M-2. Cycle 3>

In cycle 3, since the bar WE signal is a "H", it is read cycle, but the bar TEST signal is "L", and therefore "H" is given to one of the inputs of the NOR gate G80 of the OEM signal generating circuit CG1 shown in FIG. 19, and the output of the NOR gate G80 is "L" whatever the other input may be, and the output of the NAND gate G35 becomes "H", and the OEM signal becomes "L".

When the OEM signal is "L", the outputs of the NAND gates G4 and G5 of the output buffer 13 shown in FIG. 17 are "H" whatever the other input may be. To the gate electrodes of the N type MOSFETs Q11 and Q12, the outputs of the NAND gates g4 and G5 are given respectively through the inverters G2 and G3, so that the N type MOSFETs Q11 and Q12 are both in a non-conductive state, and the output buffer 13 is set in a high impedance state.

Therefore, in cycle 3, the expected value De of the data being read out from the tester 80 can be given to the DRAM chip M100C through the Dout pin.

The expected value holding circuit 12 has a latch circuit composed of inverters G6 and G7, and the expected value De of the read data given to the Dout pin is transferred to the latch circuit in the "H" period of the signal φ2. The expected value De of the readout outputted from the latch circuit is given to the comparator 11, and is compared with the read data Dr outputted from the read circuit 10.

Herein, with the expected value De of "H", when the read data Dr is "H", it means normal action, and the comparative result Dt outputted from the comparator 11 is "H". In the event of wrong action due to some cause, when the read data Dr becomes "L", the comparative result Dt is "L".

The comparative result Dt is given to the comparative result holding circuit 14 shown in FIG. 18, but the N type MOSFET Q14 is provided at the input unit of the comparative result holding circuit 14. To the gate electrode of the N type MOSFET Q14, when the Dout pin becomes "L", the signal φ4 becoming "H" only for the portion of delay time by the inverters G37, G38, G39 connected in series shown in FIG. 19 is given.

The comparative result Dt is transferred to the latch circuit composed of the inverters G14 and G15 of the comparative result holding circuit 141 for the "H" period of the signal φ4. The output of the latch circuit (FAIL signal) is reset to "L" through the N type MOSFET Q15 by the signal φ1 becoming "H" for a specific period, when getting in the test mode, but it is set to "H" when the comparative result Dt becomes "L", that is, when a wrong action occurs.

<N. Action and effect>

By constituting as explained above, the output buffer is connected to the Dout pin, and the write circuit, to the Din pin, respectively, and the DRAM chip not having bar OE pin can incorporate the test mechanism, so that the scope of the application of the invention may be extended.

<O. Modified example>

In the fourth preferred embodiment of the semiconductor memory device of the invention described herein, in FIG.

16, the expected value holding circuit 12 is connected to the Din pin, but, instead, it may be connected to the Dout pin, and the expected value De may be given from the Dout pin during the test mode period.

In FIG. 19, meanwhile, the signal φ4 is generated on the basis of the Dout signal, but it may be also constituted to generate the φ4 signal on the basis of the Din signal.

While the invention has been shown and described in detail, the foregoing description is in all aspects illustrative and not restrictive. It is therefore understood that numerous modifications and variations can be devised without departing from the scope of the invention.

I claim:

1. A semiconductor device for writing and reading data in a memory cell array through a pair of input and output wires comprising:

a data input/output terminal for input and output of said data, write means connected to said data input/output terminal for writing data in said memory cell array through said pair of input and output wires, read means for reading data from said memory cell array through said pair of input and output wires, output means connected between said data input/output terminal and said read means, for outputting the read data being read out by said read means into said data input/output terminal, expected value hold means connected to said data input/output terminal for temporarily holding received expected value data, comparative means connected to said expected value hold means and read means, for comparing said read data being read out by said read means and said expected value data, and outputting the result of comparison, comparative result hold means connected to said comparative means, for holding said result of comparison, and outputting a test result signal reflecting said result of comparison, and control means for outputting a control signal for controlling said expected value hold means, comparative result hold means, and output means, wherein correctness or incorrectness of write and read action is output based on said test result signal outputted from said comparative result hold means.

2. A semiconductor memory device of claim 1, wherein said output means comprises a buffer circuit which is set in a high impedance state by receiving said output control signal from said control means, at the time of receiving the expected value data through said input/output terminal.

3. A semiconductor memory device of claim 1, wherein said output means comprises a buffer circuit which is set in a high impedance state when the read data and expected value data do not coincide with each other.

4. A semiconductor memory device of claim 1, wherein said control means posesses an OE signal input terminal for receiving an OE signal for indicating an output timing of said data, gives a control signal on the basis of said OE signal to said comparative result hold means, and instructs the timing for holding said result of comparison.

5. A semiconductor memory device of claim 1, wherein said control means includes a plurality of signal input terminals for receiving control signals from outside, further comprising:

wrong action indicating means having at least one switch element between one of said signal input terminals and a grounding potential, for receiving said test result signal, closing said switch element when said read data and said expected value data do not coincide, and passing a current between said signal input terminal and said grounding potential, thereby indicating the write and read action is wrong.

6. A semiconductor memory device of claim 1, wherein said comparative result hold means comprises:

a first route having a resistance element and a route cut-off element disposed in series between a first potential and a second potential, a second route extended from the connection point of said resistance element and said route cut-off element, and connected to a route for outputting said test result signal, and cut-off element control means connected to said route cut-off element, receiving said comparative result, and controlling the route cut-off element so as to cut off the connection of said first route when said expected value data and said read data do not coincide, and keep the connection of said first route when said expected value data and said read data coincide with each other.

7. A semiconductor memory device of claim 6, wherein said route cut-off element is a fuse element, and said cut-off element control means has a switch element inserted between said fuse element and said second potential, closes said switch element and passes an overcurrent to said fuse element when said expected value data and read data do not coincide, and thereby melting down said fuse element and cutting off connection of said first route.

8. A semiconductor memory device of claim 6, wherein said route cut-off element is a floating gate transistor having a first electrode connected to said second potential, and said cut-off element control means comprises:

a first switch element and a resistance element inserted between a second electrode of said floating gate transistor and a third potential, and a second switch element inserted between a control electrode of said floating gate transistor and said third potential, said cut-off element control means closing said first and second switch elements, when said expected value data and read data do not coincide, and setting the potential of the control electrode of said floating gate transistor higher than the potential of the second electrode of said floating gate transistor, supplying electrons to the floating gate, and preventing the floating gate transistor from conducting, thereby cutting off connection of the first route.

9. A semiconductor device for writing and reading data in a memory cell array through a pair of input and output wires comprising:

a data input terminal for input of said data, a data output terminal for output of said data, write means connected to said data input terminal for writing data in said memory cell array through said pair of input and output wires, read means for reading data from said memory cell array through said pair of input and output wires, output means connected between said read means and said data output terminal, for outputting the read data being read out by said read means into said data output terminal, expected value hold means connected to said data input terminal for temporarily holding received expected value data, comparative means connected to said expected value hold means and read means, for comparing said read data being read out by said read means and said expected value data, and outputting the result of comparison, comparative result hold means connected to said comparative means, for holding said result of comparison, and outputting a test result signal reflecting said result of comparison, and control means for outputting a control signal for controlling said expected value hold means, comparative result hold means, and output means, wherein correctness or incorrectness of write and read action is output based on said test result signal outputted from said comparative result hold means.

10. A semiconductor memory device of claim 9, wherein said output means comprises a buffer circuit which is set in a high impedance state by receiving said test result signal, when said read data and said expected value do not coincide with each other.

11. A semiconductor memory device of claim 9, wherein said expect value hold means is connected to said data input terminal.

12. A semiconductor memory device of claim 11, wherein said control means is connected to said data output terminal, said output means comprises a buffer circuit which is set in a high impedance state by receiving an output control signal from said control means, at the time of receiving the signal indicating an output timing of said data through said data output terminal, and said control means gives a control signal on the basis of the signal indicating the output timing of said data to said comparative result hold means, and instructs the timing for holding said result of comparison.

13. A semiconductor memory device of claim 9, wherein said expected value hold means is connected to said data output terminal, said output means comprises a buffer circuit which is set in a high impedance state by receiving an output control signal from said control means, at the time of receiving the expected value data through said data output terminal.

14. A semiconductor memory device of claim 13, wherein, said control means is connected to said data input terminal, and said control means gives a control signal on the basis of the signal indicating the output timing of said data to said comparative result hold means, and instructs the timing for holding said result of comparison.

15. A semiconductor memory device of claim 9, wherein said control means includes a plurality of signal input terminals for receiving control signals, further comprising:

wrong action indicating means having at least one switch element between one of said signal input terminals and a grounding potential, for receiving said test result signal, closing said switch element when said read data and said expected value data do not coincide, and passing a current between said signal input terminal and said grounding potential, thereby indicating the write and read action is wrong.

16. A semiconductor memory device of claim 9, wherein said comparative result hold means comprises:

a first route having a resistance element and a route cut-off element disposed in series between a first potential and a second potential, a second route extended from the connection point of said resistance element and said route cut-off element, and connected to a route for outputting said test result signal, and cut-off element control means connected to said route cut-off element, receiving said comparative result, and controlling the route cut-off of element so as to cut off the connection said first route when said expected value data and said read data do not coincide, and keep the connection of said first route when said expected value data and said read data coincide with each other.

17. A semiconductor memory device of claim 16, wherein said route cut-off element is a fuse element, and said cut-off element control means has a switch element inserted between said fuse element and said second potential, closes said switch element and passes an overcurrent to said fuse element when said expected value data and read data do not coincide, and thereby melting down said fuse element and cutting off connection of said first route.

18. A semiconductor memory device of claim 16, wherein said route cut-off element is a floating gate transistor having a first electrode connected to said second potential, and said cut-off element control means comprises:

a first switch element and a resistance element inserted between a second electrode of said floating gate transistor and a third potential, and a second switch element inserted between a control electrode of said floating gate transistor and said third potential, said cut-off element control means closing said first and second switch elements, when said expected value data and read data do not coincide, and setting the potential of the control electrode of said floating gate transistor higher than the potential of the second electrode of said floating gate transistor, supplying electrons to the floating gate, and preventing the floating gate transistor from conducting, thereby cutting off connection of the first route.

* * * * *